United States Patent
Hshieh et al.

(10) Patent No.: US 6,674,124 B2
(45) Date of Patent: Jan. 6, 2004

(54) TRENCH MOSFET HAVING LOW GATE CHARGE

(75) Inventors: Fwu-Iuan Hshieh, Saratoga, CA (US); Koon Chong So, Fremont, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/002,529

(22) Filed: Nov. 15, 2001

(65) Prior Publication Data
US 2003/0089946 A1 May 15, 2003

(51) Int. Cl.[7] .................. H01L 29/76; H01L 29/94; H01L 31/113; H01L 31/119
(52) U.S. Cl. ............. 257/330; 257/331; 257/332; 257/333; 428/270
(58) Field of Search ................. 257/330–340; 438/270, 259, 242

(56) References Cited

U.S. PATENT DOCUMENTS

| | | | |
|---|---|---|---|
| 5,072,266 A | 12/1991 | Bulucea et al. | 357/23.4 |
| 5,442,214 A * | 8/1995 | Yang | 257/328 |
| 5,541,425 A | 7/1996 | Nishihara | 257/139 |
| 5,637,898 A * | 6/1997 | Baliga | 257/330 |
| 5,801,417 A * | 9/1998 | Tsang et al. | 257/331 |
| 5,866,931 A | 2/1999 | Bulucea et al. | 257/331 |
| 5,907,776 A | 5/1999 | Hshieh et al. | 438/270 |
| 6,252,277 B1 * | 6/2001 | Chan et al. | 257/330 |
| 6,274,905 B1 * | 8/2001 | Mo | 257/330 |
| 6,388,286 B1 * | 5/2002 | Baliga | 257/330 |
| 6,404,007 B1 * | 6/2002 | Mo et al. | 257/324 |
| 2001/0000919 A1 * | 5/2001 | Kocon | 257/330 |
| 2001/0028085 A1 * | 10/2001 | Blanchard | 257/330 |

FOREIGN PATENT DOCUMENTS

| | | | |
|---|---|---|---|
| JP | 05335582 | 12/1993 | H01L/29/784 |

OTHER PUBLICATIONS

Hsing–Huang Tseng et al., "A Robust Gate Dielectric for Submicron Technology," Semiconductor International, Jul. 1992, pp. 68–72.

* cited by examiner

Primary Examiner—Phat X. Cao
Assistant Examiner—Thao X. Le
(74) Attorney, Agent, or Firm—Mayer Fortkort & Williams, PC; Stuart H. Meyer, Esq.; Karin L. Williams, Esq.

(57) ABSTRACT

A trench MOSFET device comprising: (a) a silicon substrate of a first conductivity type (preferably N-type conductivity); (b) a silicon epitaxial layer of the first conductivity type over the substrate, the epitaxial layer having a lower majority carrier concentration than the substrate; (c) a body region of a second conductivity type (preferably P-type conductivity) within an upper portion of the epitaxial layer; (d) a trench having trench sidewalls and a trench bottom, which extends into the epitaxial layer from an upper surface of the epitaxial layer and through the body region of the device; (f) an oxide region lining the trench, which comprises a lower segment covering at least the trench bottom and upper segments covering at least upper regions of the trench sidewalls; (g) a conductive region within the trench adjacent the oxide region; and (h) a source region of the first conductivity type within an upper portion of the body region and adjacent the trench. The lower segment of the oxide region is thicker than the upper segments of the oxide region in this embodiment.

16 Claims, 35 Drawing Sheets

TRENCH MOSFET HAVING LOW GATE CHARGE

FIELD OF THE INVENTION

The present invention relates to microelectronic circuits, and more particularly to trench MOSFET devices having low gate charge.

BACKGROUND OF THE INVENTION

Metal oxide semiconductor field effect transistor (MOSFET) devices that use trench gates provide low turn-on resistance. In such trench MOSFET devices, the channels are arranged in a vertical manner, instead of horizontally as in most planar configurations. Such transistors provide high current per unit area where low forward voltage drops are required.

FIG. 1 shows a partial cross-sectional view of a trench MOSFET device containing an N+ substrate 1, an N– epitaxial layer 2, P body regions 3, and N+ regions 11. Typically, the P body regions 3 are diffused into the N– epitaxial layer 2, which is disposed on the N+ substrate 1, and the N+ regions 11 are in turn diffused in the body regions 3. Due to the use of these two diffusion steps, a transistor of this type is commonly referred to as a double-diffused metal oxide semiconductor field effect transistor with trench gating or, in brief, a "trench DMOS".

The trench MOSFET device shown in FIG. 1 also includes a trench 8 filled with conductive material 10, which is separated from regions 2, 3, 11 by an oxide region 15, 16. As arranged, the conductive and insulating materials 10 and 16 in the trench 8 form the gate and gate oxide layer, respectively, of the trench MOSFET. The N+ regions 11 form the sources for the device, and the epitaxial layer 2 and N+ substrate 1 together form the drain of the trench MOSFET device. When a potential difference is applied across the P body 3 and the gate 10, charges are capacitively induced within the body region 3, resulting in the formation of a channel within the P body region 3 of the trench MOSFET device adjacent the trench 8. When another potential difference is applied across the sources 11 and the drain 1,2, a current flows from the source metal 14 to the drain 1,2 through the channel, and the trench MOSFET device is said to be in the power-on state.

Examples of trench MOSFET transistors are disclosed, for example, in U.S. Pat. Nos. 5,907,776, 5,072,266, 5,541, 425, and 5,866,931, the entire disclosures of which are hereby incorporated by reference.

A typical MOSFET device includes numerous individual MOSFET transistor cells that are fabricated in parallel within a single chip (i.e., a section of a semiconductor wafer). Hence, a chip like that shown in FIG. 1 typically contains numerous cells. Square-shaped and hexagonal cell configurations are common. In a design like that shown in FIG. 1, the substrate region 1 acts as a common drain contact for all of the individual MOSFET transistor cells. All the sources 11 for the MOSFET cells are typically shorted together via a metal source contact 14 that is disposed on top of the N+ source regions 11. An insulating region 12, such as borophosphosilicate glass, is typically placed between the conductive material 10 in the trenches 8 and the metal source contact 14 to prevent the gates 10 from being shorted with the source regions 11. Consequently, to make contact with the gates 10, the conductive material within the trenches is typically extended into a termination region beyond the MOSFET cells, where a metal gate contact is provided. Since the conductive regions are interconnected with one another via the trenches, this arrangement provides a single gate contact for all the gate regions of the device. As a result of this scheme, even though the chip contains a matrix of individual transistor cells, these cells behave as a single large transistor.

Demand persists for trench MOSFET devices having ever-lower on-resistance. The simplest way to reduce on-resistance is to increase cell density. Unfortunately, the gate charges associated with trench MOSFET devices increase when cell density is increased. The device of FIG. 1 is disclosed in JP05335582 to Omron Corp. and entitled "Vertical MOSFET device and Manufacture thereof", the complete disclosure of which is hereby incorporated by reference. This device takes advantage of the fact that oxide film at the trench sidewall forms the channel within the P-body region 3, while oxide film at the bottom of the trench does not contribute significantly to channel formation, but nonetheless contributes to gate charges. In response, the oxide film 15 at the bottom of the trench 8 can be thickened substantially relative to the oxide film 16 at the sidewall to reduce gate charges. According to the JP05335582 abstract, the thick gate oxide film 15 is formed at the bottom of the groove by stacking oxide films by decompressed CVD until the trench 8 flattens, and etching back this oxide film to form the thick oxide film 15 at the bottom of the trench 8. Subsequently the thinner gate oxide film 16 is formed at the sidewall of the trench 8 by thermal oxidation.

SUMMARY OF THE INVENTION

Unfortunately, a gate oxide formed by CVD, such as that described in the JP05335582 abstract, creates a high state charge at the interface between the CVD gate oxide and the silicon. This and other disadvantages of the devices of the prior art are addressed by the design and manufacture of the trench MOSFET devices of the present invention.

According to an embodiment of the invention, a trench MOSFET device is provided, which comprises: (a) a silicon substrate of a first conductivity type (preferably N-type conductivity); (b) a silicon epitaxial layer of the first conductivity type over the substrate, the epitaxial layer having a lower majority carrier concentration than the substrate; (c) a body region of a second conductivity type (preferably P-type conductivity) within an upper portion of the epitaxial layer; (d) a trench having trench sidewalls and a trench bottom, which extends into the epitaxial layer from an upper surface of the epitaxial layer and through the body region of the device; (f) an oxide region lining the trench, which comprises a lower segment covering at least the trench lower and upper segments covering at least upper regions of the trench sidewalls; (g) a conductive region within the trench adjacent the oxide region; and (h) a source region of the first conductivity type within an upper portion of the body region and adjacent the trench. The lower segment of the oxide region is thicker than the upper segments of the oxide region in this embodiment. Moreover, those portions of the oxide region that form interfaces with the silicon are thermally grown.

According another embodiment of the invention, a trench MOSFET device is provided which comprises: (a) a silicon substrate of a first conductivity type (preferably N-type conductivity); (b) a silicon epitaxial layer of the first conductivity type over the substrate, the epitaxial layer having a lower majority carrier concentration than the substrate; (c) a body region of a second conductivity type (preferably P-type conductivity) within an upper portion of the epitaxial layer; (d) a trench having trench sidewalls and a trench bottom, which extends into the epitaxial layer from an upper surface of the epitaxial layer and extends through the body region; (e) an oxide region lining the trench, which comprises a lower segment covering at least the trench bottom and upper segments covering at least upper regions of the trench sidewalls; (f) a conductive region within the trench adjacent the oxide region; and (g) a source region of the first conductivity type within an upper portion of the body region and adjacent the trench. In this embodiment, the lower segment of the oxide region is thicker than the upper segments of the oxide region, establishing shoulders in the oxide region that are adjacent the conductive region along the trench sidewalls.

In some embodiments, the lower segment of the oxide region includes a thermally grown portion (which can range, for example, from 500 to 2000 Angstroms in thickness) adjacent the trench and a deposited oxide portion (which can also range, for example, from 500 to 2000 Angstroms in thickness) adjacent the conductive region, while the upper segments of the oxide region consist of thermally grown oxide (which can range, for example, from 100 to 1000 Angstroms in thickness). The deposited oxide portion is preferably densified TEOS.

In other embodiments, the lower segment of the oxide region is a thick thermally grown oxide region (which can range, for example, from 500 to 2000 Angstroms in thickness), while the upper segments of the oxide region are thin thermally grown oxide regions (which can range, for example, from 100 to 1000 Angstroms in thickness).

Preferably, the conductive region of the device comprises polycrystalline silicon. In some embodiments, the conductive region comprises a polycrystalline silicon portion and a portion selected from a refractory metal and a refractory metal alloy (for example, a tungsten portion or a titanium-tungsten alloy portion). In other embodiments, the conductive region comprises a polycrystalline silicon portion and a refractory metal silicide portion (e.g., a titanium silicide portion).

According another embodiment of the invention, a trench MOSFET device is provided which comprises: (a) a silicon substrate of first conductivity type (preferably N-type conductivity); (b) a silicon epitaxial layer of the first conductivity type over the substrate, the epitaxial layer having a lower majority carrier concentration than the substrate; (c) a body region of second conductivity type (preferably P-type conductivity) within an upper portion of the epitaxial layer; (d) a trench having trench sidewalls and a trench bottom, which extends into the epitaxial layer from an upper surface of the epitaxial layer and extends through the body region; (e) an oxide region lining the trench, the oxide region comprising (i) a unshaped lower segment covering the trench bottom and lower regions of the trench sidewalls and (ii) upper segments covering at least upper regions of the trench sidewalls; (f) a conductive region within the trench adjacent the oxide region; and (g) a source region of the first conductivity type within an upper portion of the body region and adjacent the trench. In this embodiment, the unshaped lower segment of the oxide region is thicker than the upper segments of the oxide region.

According to yet another embodiment of the invention, a method of forming a trench MOSFET device is provided which comprises: (a) providing a silicon substrate of a first conductivity type; (b) providing a silicon epitaxial layer of the first conductivity type over the substrate, the epitaxial layer having a lower majority carrier concentration than the substrate; (c) forming a body region of a second conductivity type within an upper portion of the epitaxial layer; (d) etching a trench extending into the epitaxial layer from an upper surface of the epitaxial layer, the trench extending through the body region and the trench having trench sidewalls and a trench bottom; (f) forming an oxide region lining the trench, the oxide region comprising a lower segment covering at least the trench bottom and upper segments covering at least upper regions of the trench sidewalls; (g) depositing a conductive region within the trench adjacent the oxide region; and (h) forming a source region of the first conductivity type within an upper portion of the body region and adjacent the trench. The lower segment of the oxide region formed in this embodiment is thicker than the upper segments of the oxide region, such that shoulders are established in the oxide region adjacent the conductive region along the trench sidewalls.

In some embodiments, the oxide region lining the trench is formed by a process comprising: (a) forming a thermal oxide layer within the trench; (b) providing a deposited oxide layer over the thermal oxide layer; (c) forming an etch resistant region (for example, a photoresist region or a polysilicon region) in the trench bottom over the deposited oxide layer; and (d) etching the deposited oxide layer where not covered by the etch resistant region. A thermal oxidation step is preferably carried out after the deposited oxide-etching step.

In other embodiments, the oxide region lining the trench is formed by a process comprising: (a) forming a thick thermal oxide layer within the trench; (b) forming an etch resistant region (for example, a photoresist region or a polysilicon region) in the trench bottom over the thick thermal oxide layer; and (c) etching the thermal oxide layer where not covered by the etch resistant region. A thermal oxidation step is preferably carried out after the thermal oxide etching step.

One advantage of the present invention is that an improved trench MOSFET device can be provided which has a high cell density, and hence low on resistance, while at the same time providing an acceptably low gate charge.

Another advantage of the present invention is that a trench MOSFET device having a thick layer of oxide at the trench bottom can be provided without simultaneously creating undesirably high state charge levels at the oxide/semiconductor interface.

Another advantage of the present invention is that a trench MOSFET device can be provided in which an interface between a CVD oxide and silicon is avoided, reducing the state charge levels associated with interfaces of this nature.

Another advantage of the present invention is that a trench MOSFET device can be provided in which a high quality oxide/silicon interface, typically formed by thermal oxidation, can be provided within the gate trenches, providing an acceptably low level of interfacial state charges.

These and other embodiments and advantages of the present invention will become immediately apparent to those of ordinary skill in the art upon review of the Detailed Description and Claims to follow.

DETAILED DESCRIPTION OF PREFERRED EMBODIMENTS OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

Figure 1:
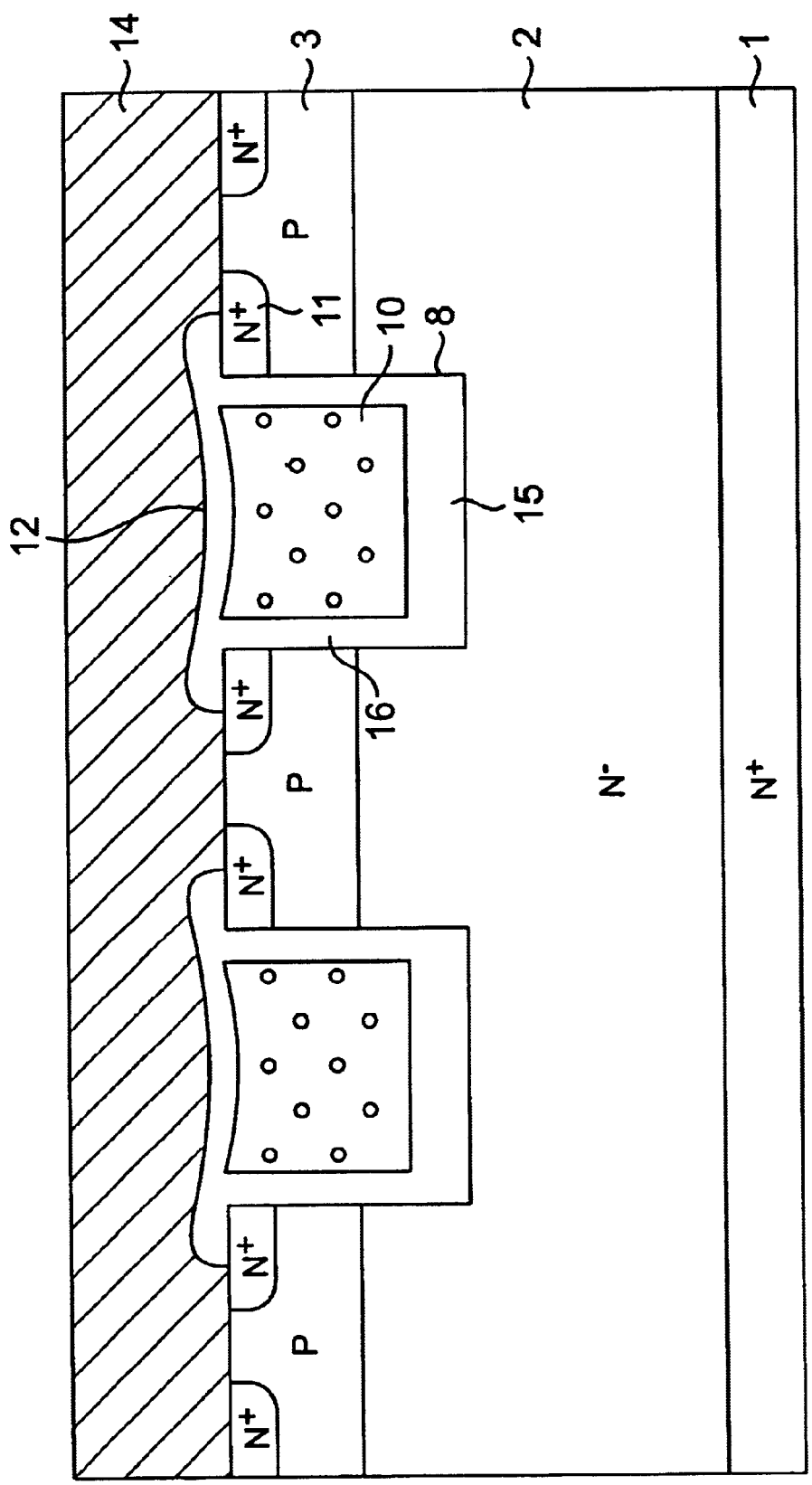
FIG. 1 is a schematic partial cross-sectional view of a trench MOSFET transistor device of the prior art.
Figure 2:
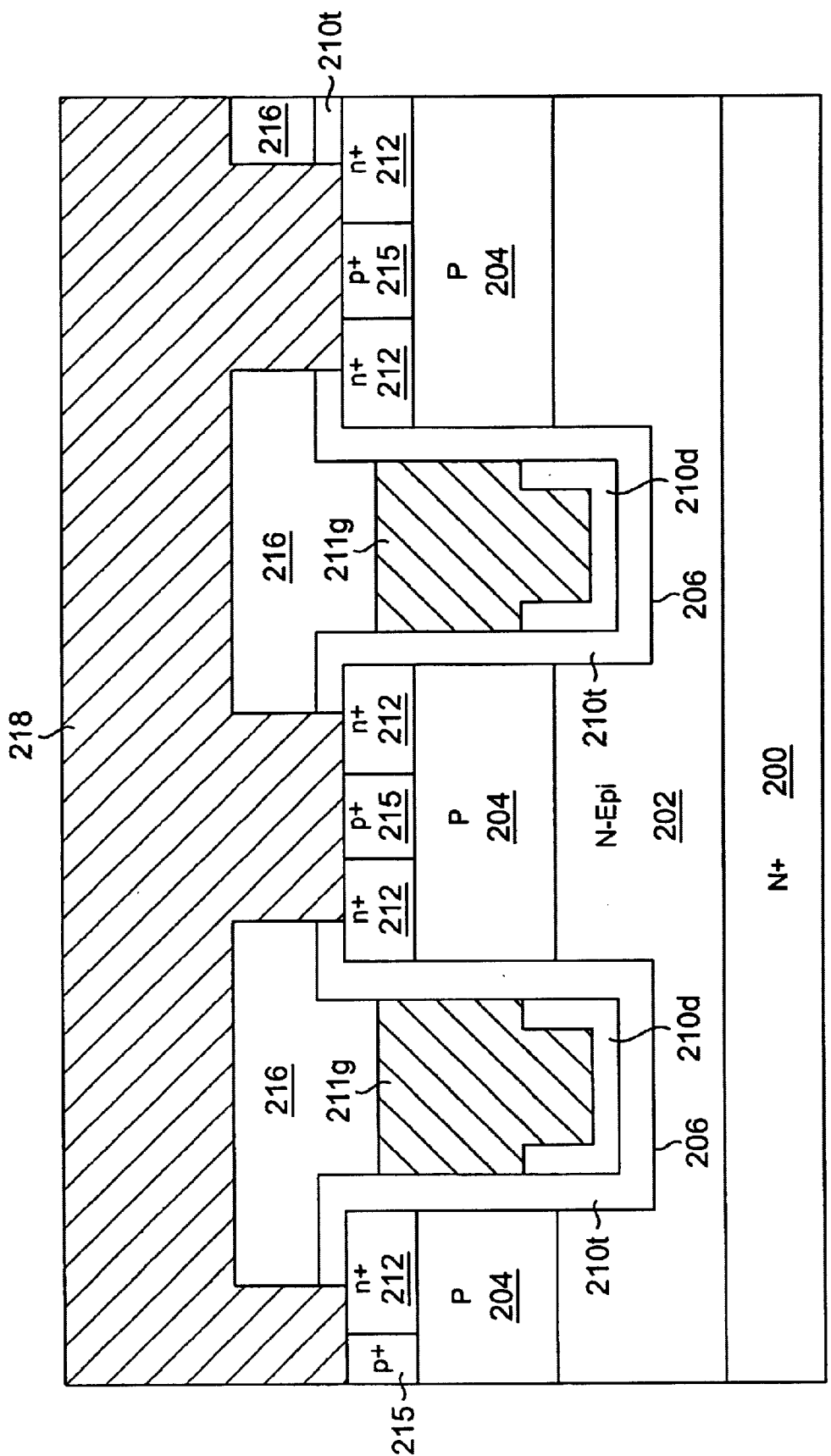
FIG. 2 is a schematic partial cross-sectional view of a trench MOSFET transistor device in accordance with an embodiment of the invention.

One embodiment of a trench MOSFET of the present invention is shown in partial cross section in FIG. 2. The trench MOSFET shown contains an N-type epitaxial layer 202, which is provided on an N+ substrate 200. The N+ substrate 200 is typically a silicon substrate having a thickness ranging, for example, from 10 to 25 mils and a resistivity ranging, for example, from 0.005 to 0.01 Ohm-cm. The N-type epitaxial layer 202 is also typically silicon having a thickness ranging from for example, 5 to 6 microns and a resistivity ranging, for example, from 0.18 to 0.25 Ohm-cm.

Trenches 206 formed within the epitaxial layer are lined with thermally grown oxide regions 210$t$ and also contain deposited oxide regions 210$d$ at the trench bottom. Note that the trench bottom can have a variety of configurations including v-shaped, rounded u-shaped, and square u-shaped configurations. The trench sidewalls are substantially vertical, typically having angles ranging from 75 degrees (tapered) to 90 degrees (vertical) to 100 degrees (reentrant), more preferably from 85 to 90 degrees. The trenches 206 are further filled with polysilicon regions 211$g$. The polysilicon regions 211$g$ typically have a resistivity ranging from 15 to 25 Ohm/sq. The trenches 206 typically have a depth of 1.0 to 2.0 microns and a width of 0.2 to 2 microns. The regions between the trenches are frequently referred to as mesas or trench mesas, based on their shapes, and are typically 0.2 to 1.0 microns in width.

The thermally grown oxide regions 210$t$ typically range from 100 to 1000 Angstroms in thickness, while the deposited oxide regions 210$d$ typically range from 500 to 2000 Angstroms in thickness. In constructing a composite oxide region in this fashion, the trench MOSFET device can be provided with a very high cell density (e.g., 20M to 500M/in.sq.). The gate charges associated with this high cell density are held in check by providing thick oxide regions at the trench bottom, consisting of both thermally grown oxide regions 210$t$ and deposited oxide regions 210$d$. As previously noted, the portions of the oxide regions at the trench bottoms 210$d$, 210$t$ are not significantly involved in channel formation during operation and hence can be of considerable thickness, reducing gate charges. On the other hand, portions of the thermally grown gate oxide region 210$t$ along the trench sidewalls above the deposited oxide regions 210$d$ are sufficiently thin to effectively form a channel region within the adjacent P-body regions 204 during operation. Moreover, thermally grown oxide regions 210$t$, rather than deposited oxide regions 210$d$, are adjacent the silicon. As a result, the high state charge that is found at the interface between the silicon and the deposited oxide in prior art structures (e.g., the structure disclosed in the abstract of JP05335582) is avoided.

Within the epitaxial layer are P-body regions 204. Resistivities ranging from 0.1 to 1.0 Ohm-cm and depths of 1 to 2 microns from the surface of the epitaxial layer are typical of such structures. The trench MOSFET device of FIG. 2 also contains N+ source regions 212, which typically extend to a depth of 0.3 to 0.45 microns from the epitaxial layer surface and typically have resistivities of 0.001 to 0.003 Ohm-cm.

In the embodiment shown, P-body upper regions (p+ regions) 215 are provided between the n+ source regions 212 for purposes of forming good ohmic contact with the electrode 218. These regions 215 are shown as extending to approximately the same depth as the n+ source regions 212, but other depths are clearly possible. Resistivities of 0.002 to 0.005 Ohm-cm are typical.

Electrical contact is made with the n+ source regions 212 via metal source contact 218. Insulating regions 216, typically BPSG (borophosphosilicate glass), prevent the polysilicon regions 211$g$ associated with the gate electrodes from being shorted to the n+ source regions 212 through source contact 218. A separate metal gate contact (not shown) is typically connected to the gate runner portion of the polysilicon that is located outside of the region of the trench MOSFET cells. A metal drain contact (not shown) is also typically provided in electrical connection with the N+ substrate 200.

Figure 3:
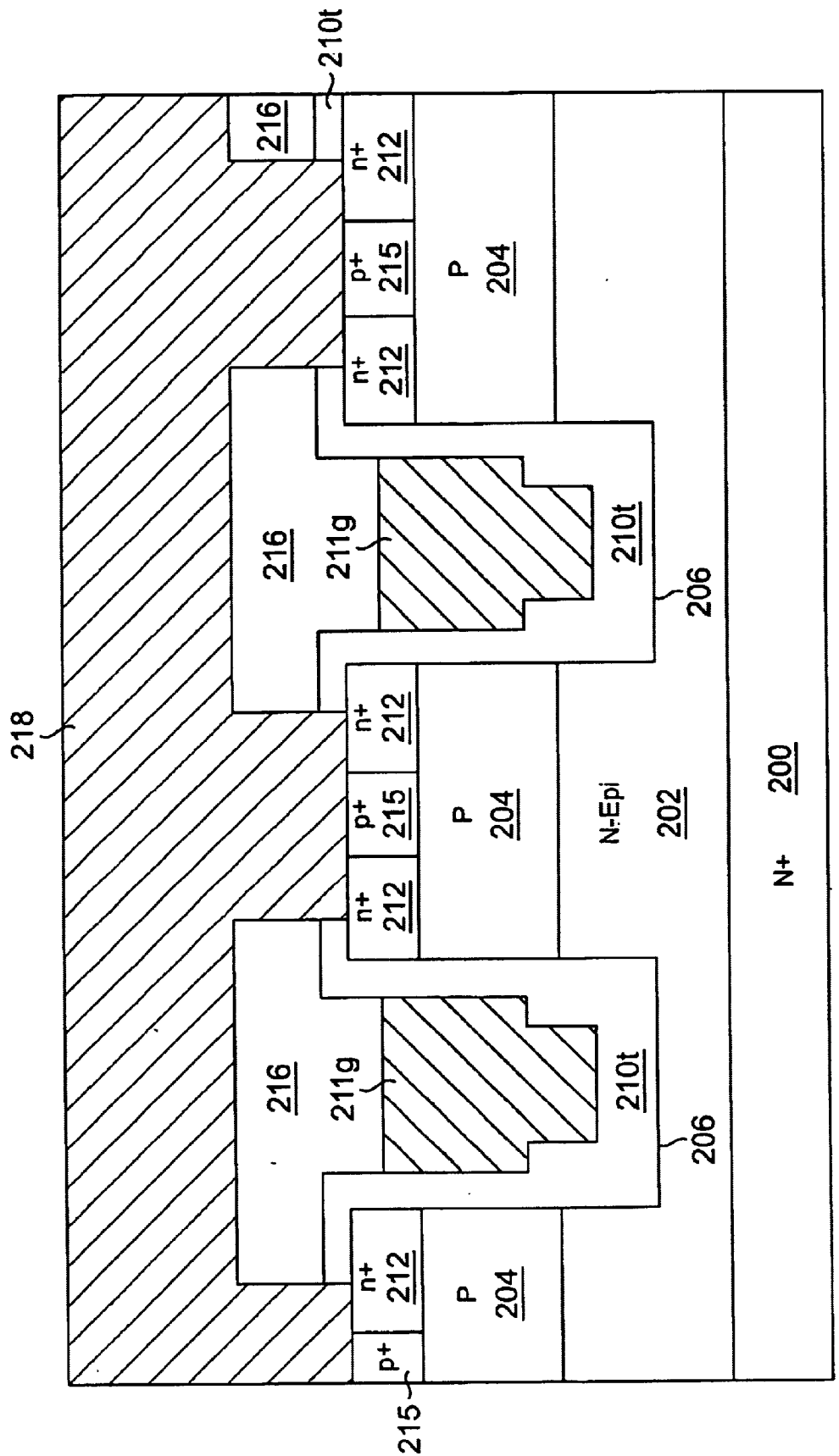
FIG. 3 is a schematic partial cross-sectional view of a trench MOSFET transistor device in accordance with another embodiment of the invention.

Another embodiment of the invention is shown in FIG. 3. FIG. 3 is essentially the same as FIG. 2, except for the configuration of the oxide regions lining the trenches. Specifically, whereas FIG. 2 contains oxide regions that are a combination of thermally grown oxide regions 210$t$ and deposited oxide regions 210$d$, the oxide regions of FIG. 3 are entirely formed from thermally grown oxide 210$t$. Nonetheless, as in FIG. 2, the oxide regions 210$t$ within the trenches 206 are thicker at the trench bottoms (typically 500 to 2000 Angstroms in thickness) than they are along the upper portions of the trench sidewalls (typically 100 to 1000 Angstroms). In this way, gate function is maintained, while reducing the gate charges associated with the device.

Moreover, high interface state charges are avoided, because thermally grown oxide regions 210t, rather deposited oxide regions, are placed adjacent the silicon.

Figure 4:
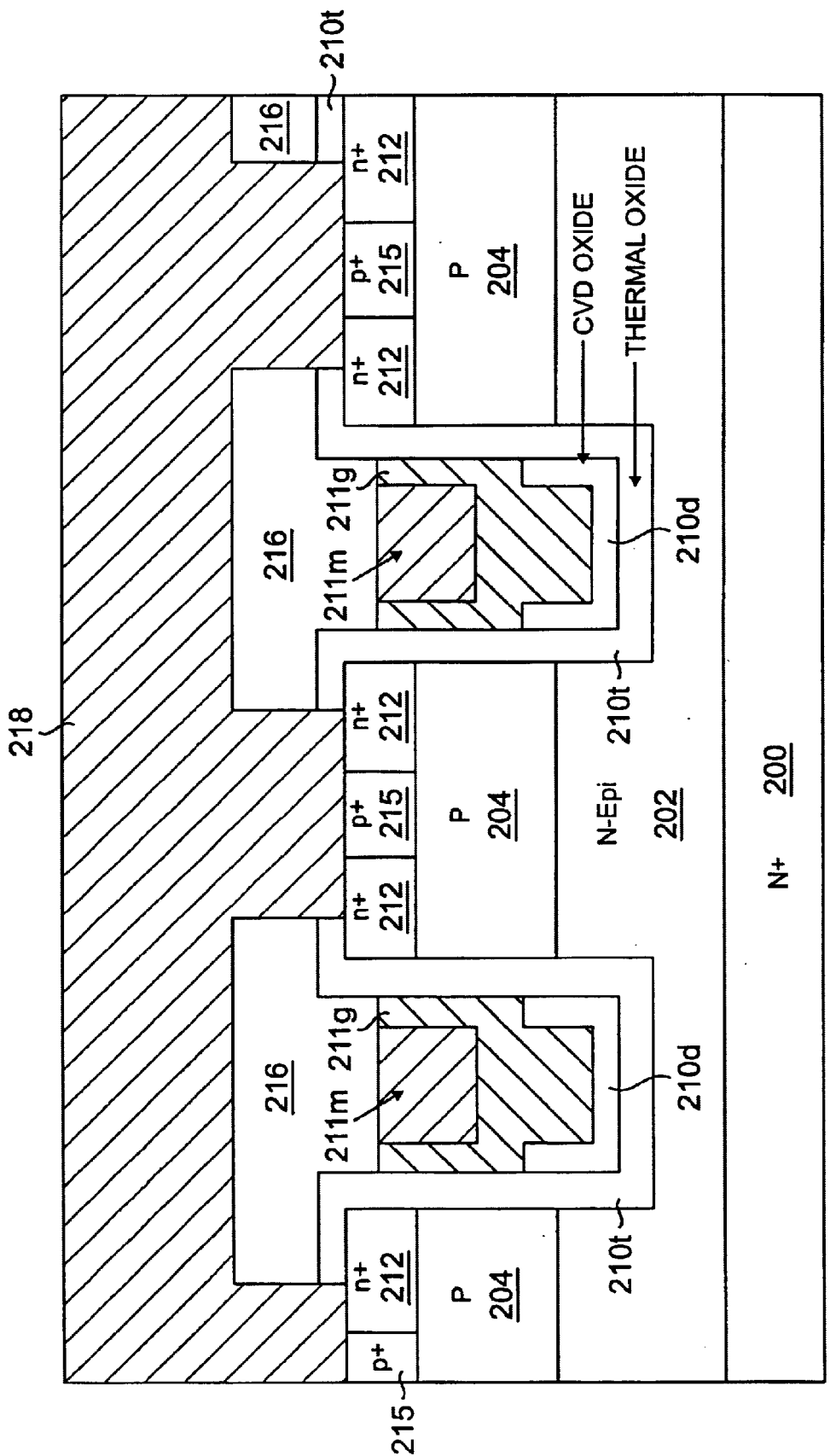
FIG. 4 is a schematic partial cross-sectional view of a trench MOSFET transistor device in accordance with another embodiment of the invention.
Figure 5:
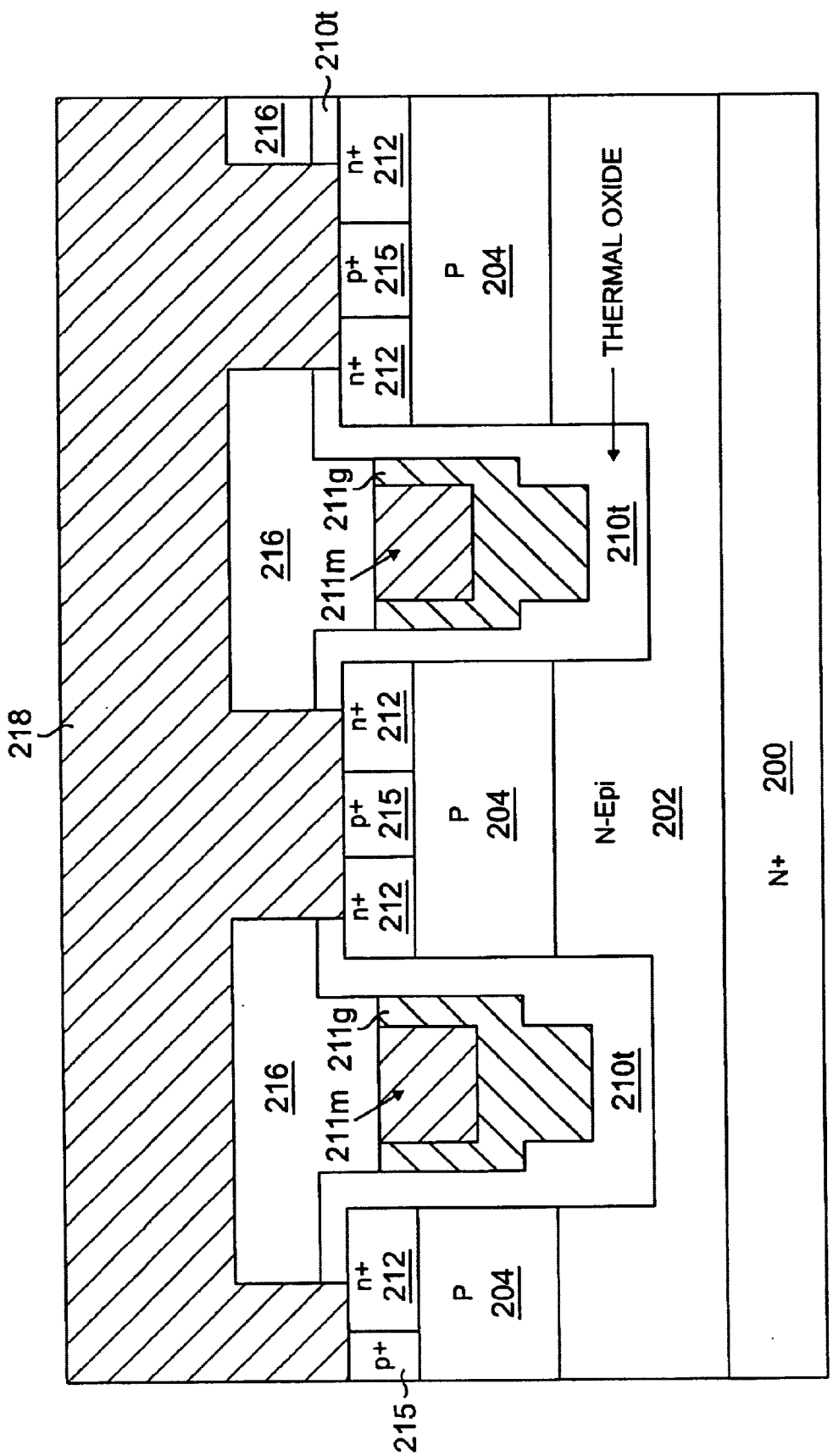
FIG. 5 is a schematic partial cross-sectional view of a trench MOSFET transistor device in accordance with another embodiment of the invention.

Other embodiments of the invention are shown in FIG. 4 and FIG. 5. FIG. 4 and FIG. 5 are essentially the same as FIG. 2 and FIG. 3, respectively. However, the polysilicon gate regions 211g of FIGS. 2 and 3 are replaced by composite gate regions consisting of both polysilicon gate regions 211g and tungsten metal regions 211m. These embodiments provide lower gate resistance relative to a device containing only polysilicon gate regions, improving switching frequency. In alternative embodiments, the tungsten metal is replaced by other refractory metals and metal alloys, such as titanium-tungsten alloys.

Figure 6:
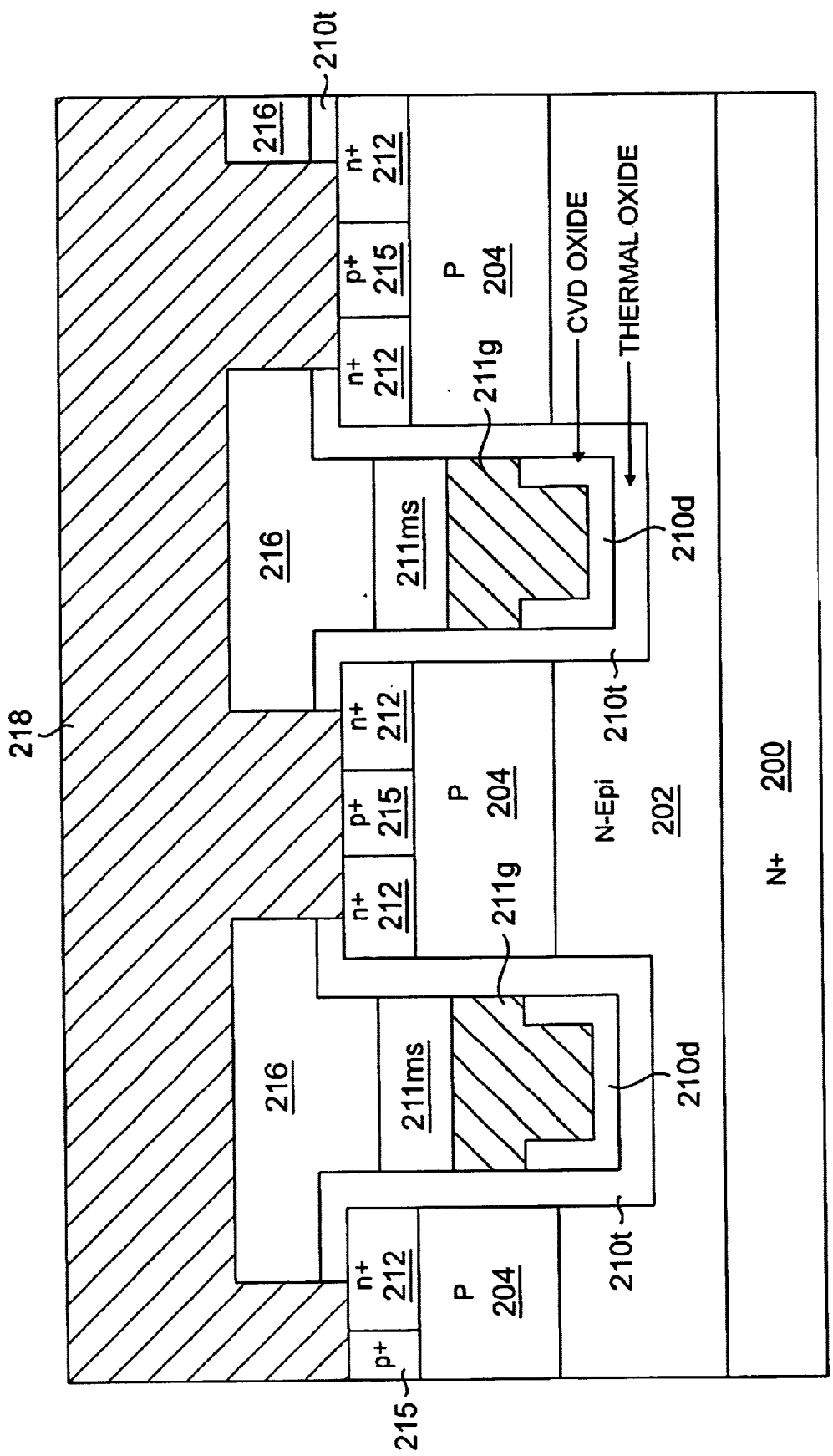
FIG. 6 is a schematic partial cross-sectional view of a trench MOSFET transistor device in accordance with yet another embodiment of the invention.
Figure 7:
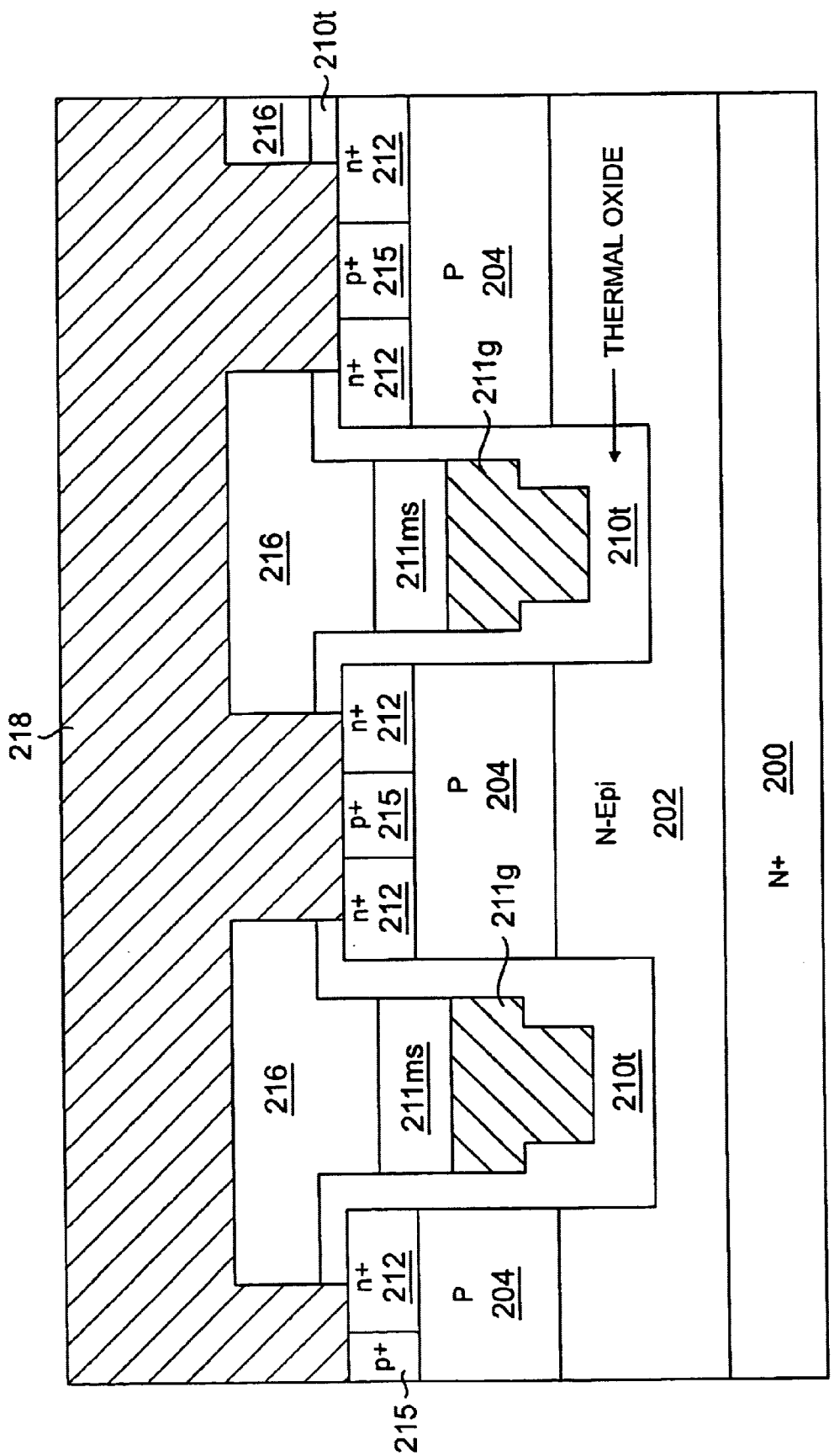
FIG. 7 is a schematic partial cross-sectional view of a trench MOSFET transistor device in accordance with still another embodiment of the invention.

Still other related embodiments of the invention are shown in FIG. 6 and FIG. 7. FIG. 6 and FIG. 7 are essentially the same as FIG. 2 and FIG. 3, respectively, except that the polysilicon gate regions 211g of FIGS. 2 and 3 are replaced by composite gate regions. In FIGS. 6 and 7, these regions consist of both polysilicon gate regions 211g and refractory metal silicide regions 211ms such as titanium silicide (typically $TiSi_2$). Refractory metals that readily form silicides include titanium, tungsten, tantalum, and molybdenum.

An embodiment of a process for the manufacture of a device like that of FIG. 2 will now be described in connection with FIGS. 8A to 8G. In these figures, an N doped epitaxial layer 202 is initially grown on an N+ doped substrate 200. For example, epitaxial layer 202 can be 6.0 microns thick and have an n-type doping concentration of bout $3.4 \times 10^{16}$ cm$^{-3}$, while N+ doped substrate 200 can be 250 microns thick and have n-type doping concentration of about $5 \times 10^{19}$ cm$^{-3}$. A P-type layer 204 is then formed in the epitaxial layer 202 by implantation and diffusion. For example, the epitaxial layer 202 may be implanted with boron at 40 keV with a dosage of $6 \times 10^{13}$ cm$^{-2}$, followed by diffusion to a depth of 1.8 microns at 150° C.

A mask oxide layer (not shown) is then deposited, for example by chemical vapor deposition, and covered with a patterned trench mask (not shown). The mask oxide layer is then etched, for example, by buffered HF, forming a patterned mask oxide layer (not shown). Trenches 206 are subsequently etched through apertures in the patterned mask oxide layer, typically by reactive ion etching. Trench depths can be, for example, about 2.0 μm. Discrete P-body regions 204 are established as a result of this trench-forming step. A sacrificial oxide (not shown) is then grown, typically by dry oxidation to improve the quality of the silicon surface. This oxide is then removed, typically by buffered HF, forming the structure illustrated in FIG. 8A.

A thermal gate oxide layer 210t is grown over the entire device, for example, by dry oxidation at 900 to 1150° C. A thickness in the range of 100 to 1000 Angstroms is preferred for the thermal gate oxide layer 210. Then, a TEOS (i.e., tetraethylorthosilicate or $Si(OC_2H_5)_4$) layer 210 is deposited, for example, by PECVD (plasma enhanced chemical vapor deposition) at temperatures between 500 and 600° C., to provide the structure of FIG. 8B. The TEOS layer 210 typically ranges from 400 to 1000 Angstroms in thickness.

Figure 8A:
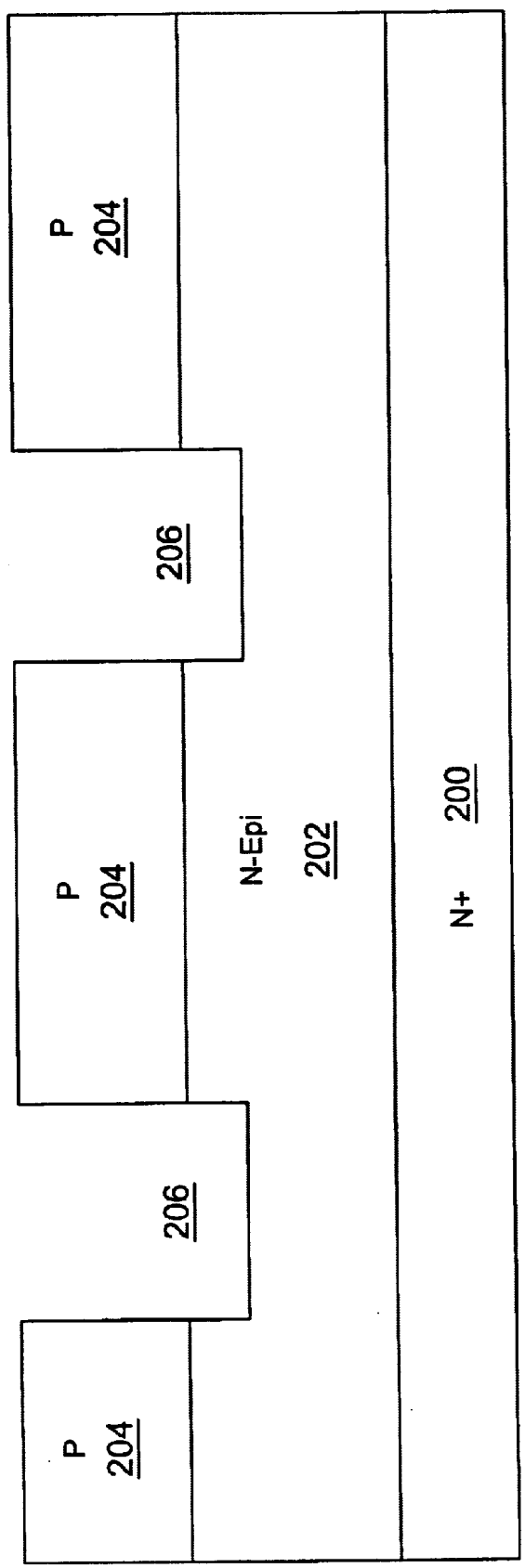
FIG. 8A through FIG. 8G are schematic partial cross-sectional views illustrating a process for manufacturing the trench MOSFET transistor device like that of FIG. 2.
Figure 8B:
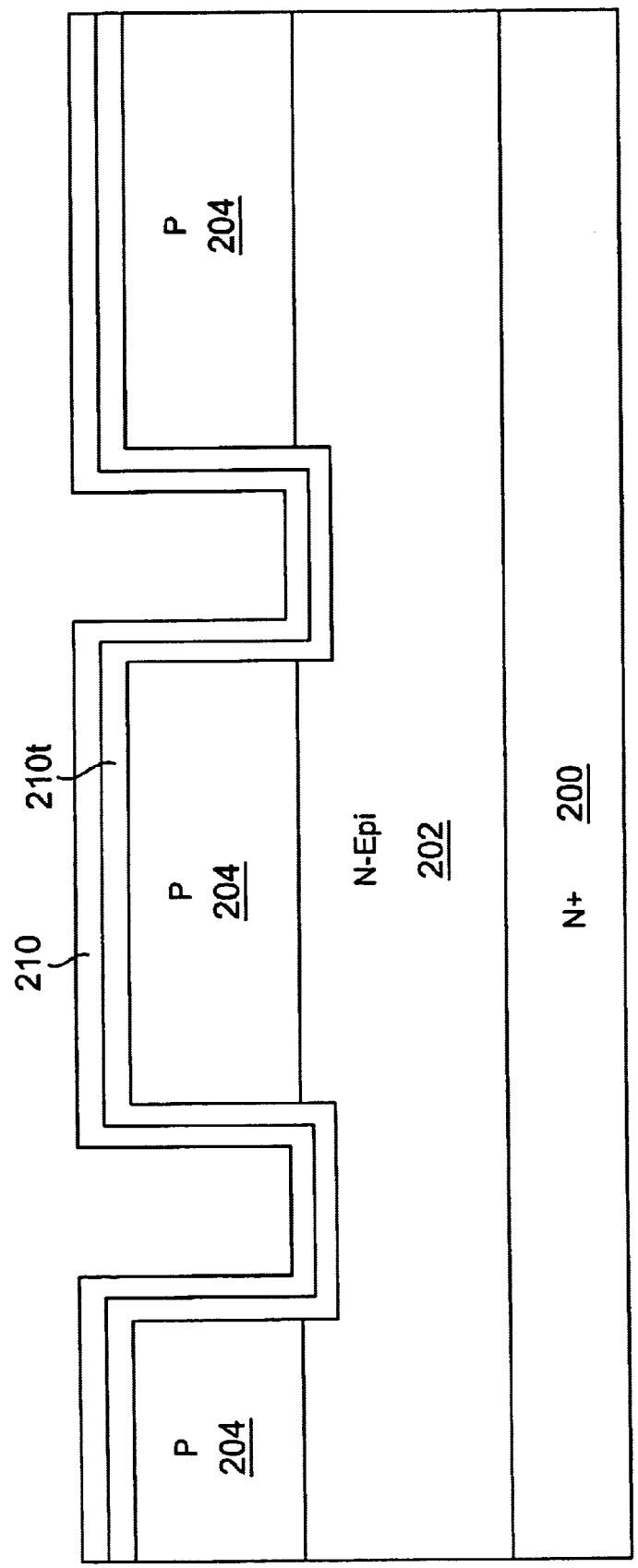
Figure 8C:
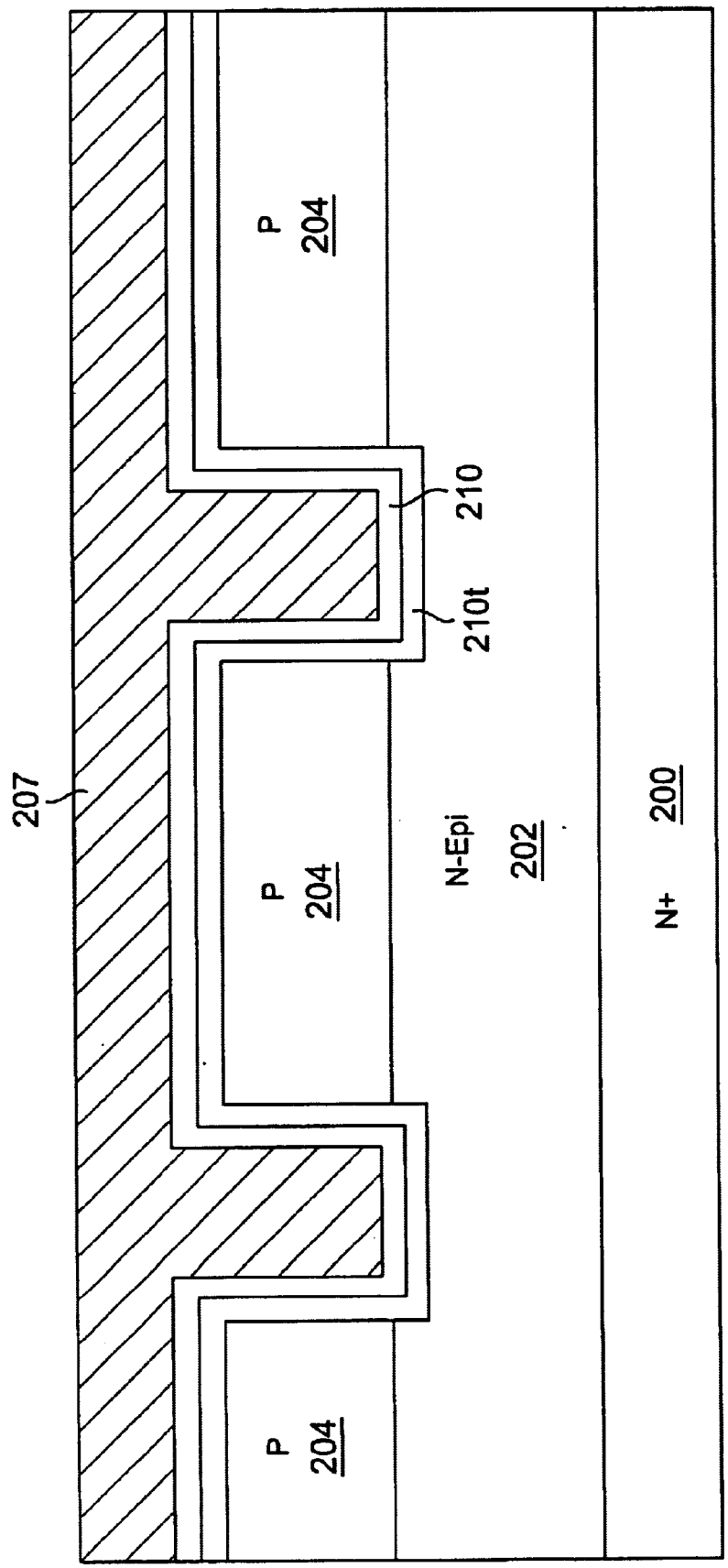
Figure 8D:
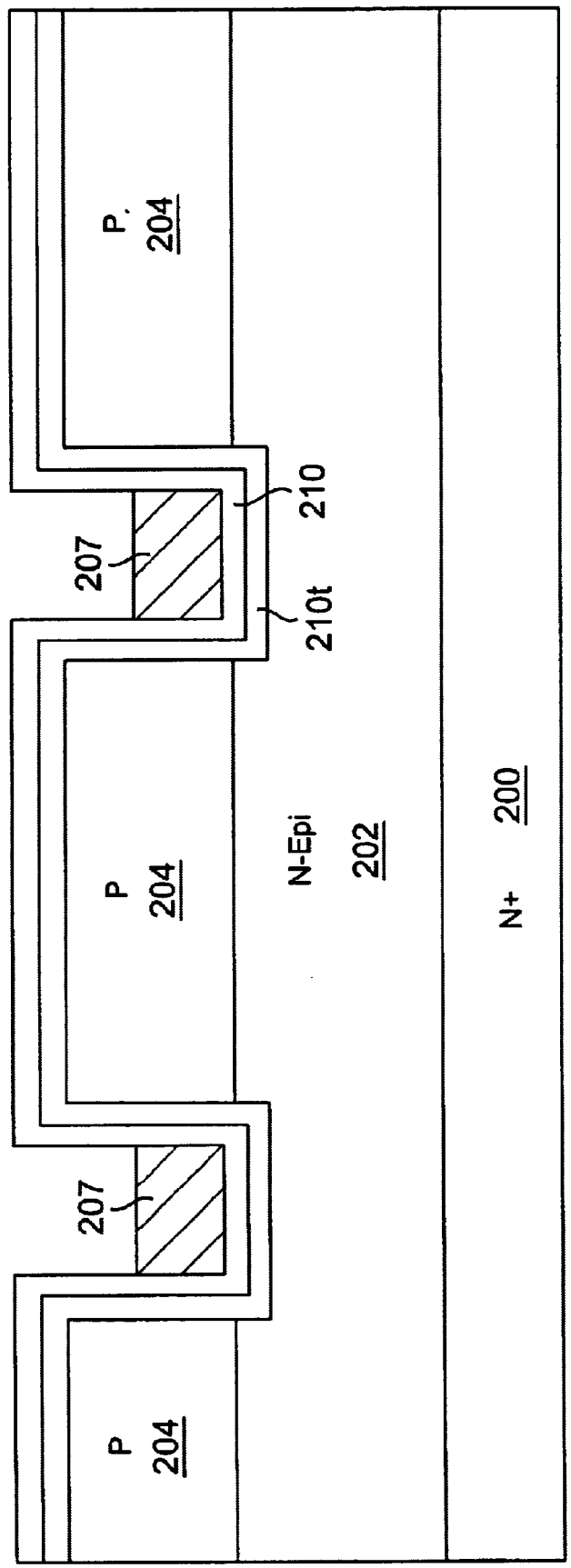
Figure 8E:
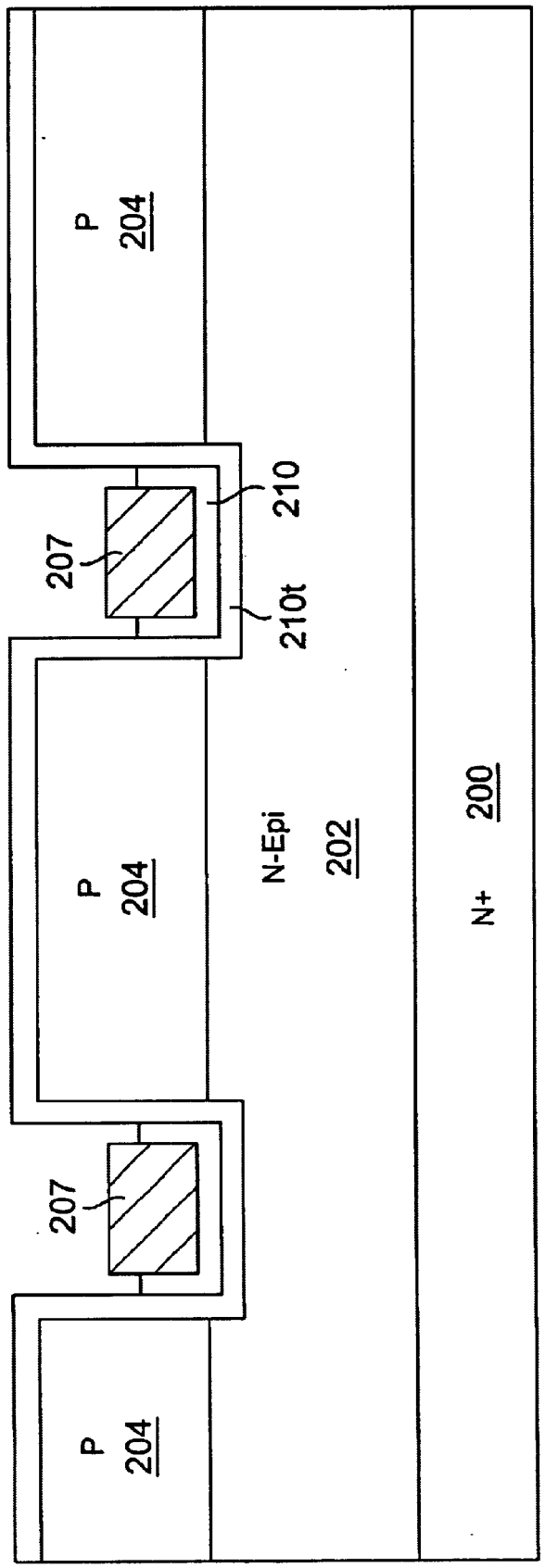

The surface of the structure is then covered, and the trenches are filled, with a photoresist layer 207 to provide the structure of FIG. 8C. The resist layer is then etched, for example, by reactive ion etching, until all of the photoresist is removed except for resist portions 207 at the bottom of the trenches, providing the structure of FIG. 8D. The TEOS layer 210 is then etched, for example, by buffered HF to produce the structure of FIG. 8E.

The remaining resist 207 is removed, for example, by sulfuric acid. Subsequently, the TEOS regions 210 are densified, for example, by annealing at 950° C. in $N_2$ to provide high-density deposited silicon dioxide regions 210d. The structure then undergoes an additional thermal oxidation step, for example, 10 to 20 minutes at 950 to 1150 C., to ensure that those portions of the gate oxide layer 210t not covered by deposited oxide 210d are of sufficient thickness. Thicknesses ranging from 10 to 1000 Angstroms are typical.

Figure 8F:
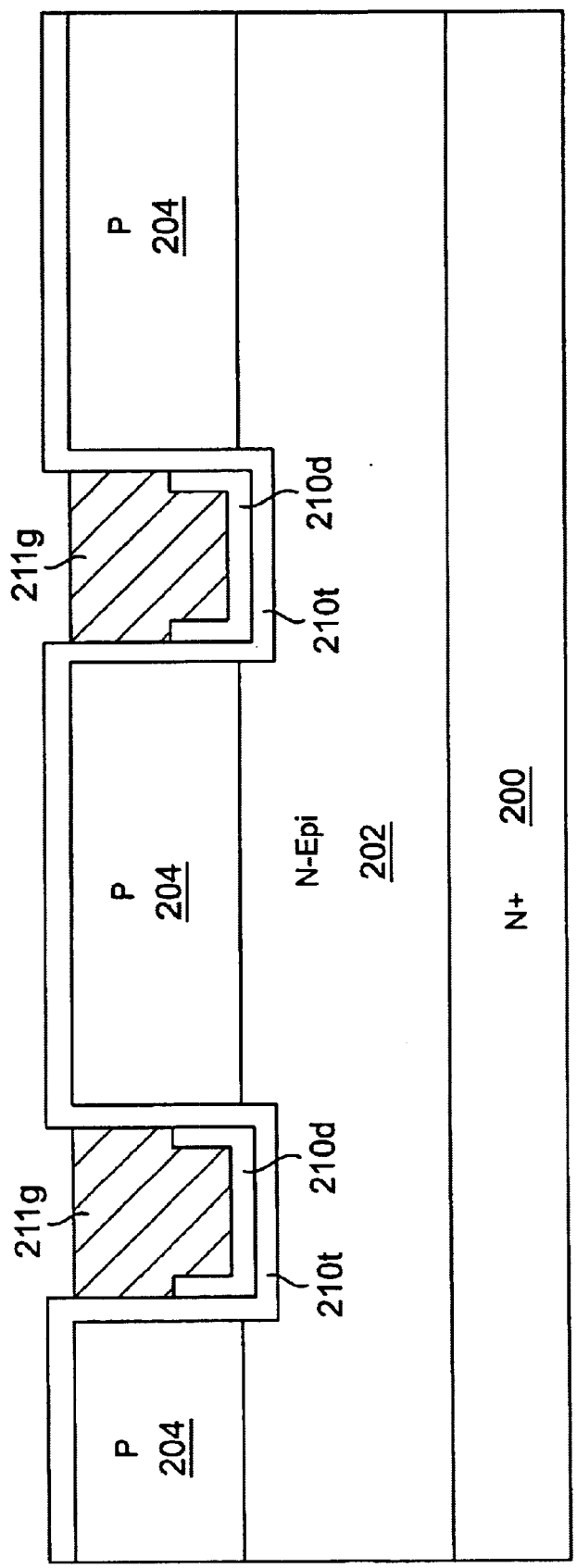

The surface of the structure is then covered, and the trenches are filled, with a polysilicon layer, typically using CVD. The polysilicon is typically doped N-type to reduce its resistivity, generally on order of 20 Ω/sq. N-type doping can be carried out, for example, during CVD with phosphorous chloride or by implantation with arsenic or phosphorous. As is typical, a patterned masking layer (not shown) is provided to preserve polysilicon in the gate runner region, and the unmasked portions of the polysilicon layer are etched, for example, by reactive ion etching. The polysilicon layer within the trench segments is slightly over-etched due to etching uniformity concerns, and the thus-formed polysilicon gate regions 211g typically have top surfaces that are 0.1 to 0.2 microns below the adjacent surface of the epitaxial layer 204. The resulting structure is shown in FIG. 8F.

The oxide layer 210t is then wet etched to a thickness of 100 Angstroms to form an implant oxide (not shown). The implant oxide avoids implant-channeling effects, implant damage, and heavy metal contamination during subsequent formation of source regions. Source regions 212 are formed within upper portions of the P-body regions 204 via an implantation and diffusion process, using a patterned masking layer (not shown). For example, the source regions 212 may be implanted with arsenic at a dosage of $1 \times 10^{16}$ cm$^{-2}$ and diffused to a depth of 0.4 microns at a temperature of 950° C. An additional mask (not shown) is then formed, followed by implantation and diffusion of boron to form P-body upper portions 215 (p+ regions) between n+ regions 212. For example, the P-body upper portions 215 may be implanted with boron at a dosage of 1.5e14 cm$^{-2}$ and diffused to a depth of 0.3–0.6 microns.

Figure 8G:
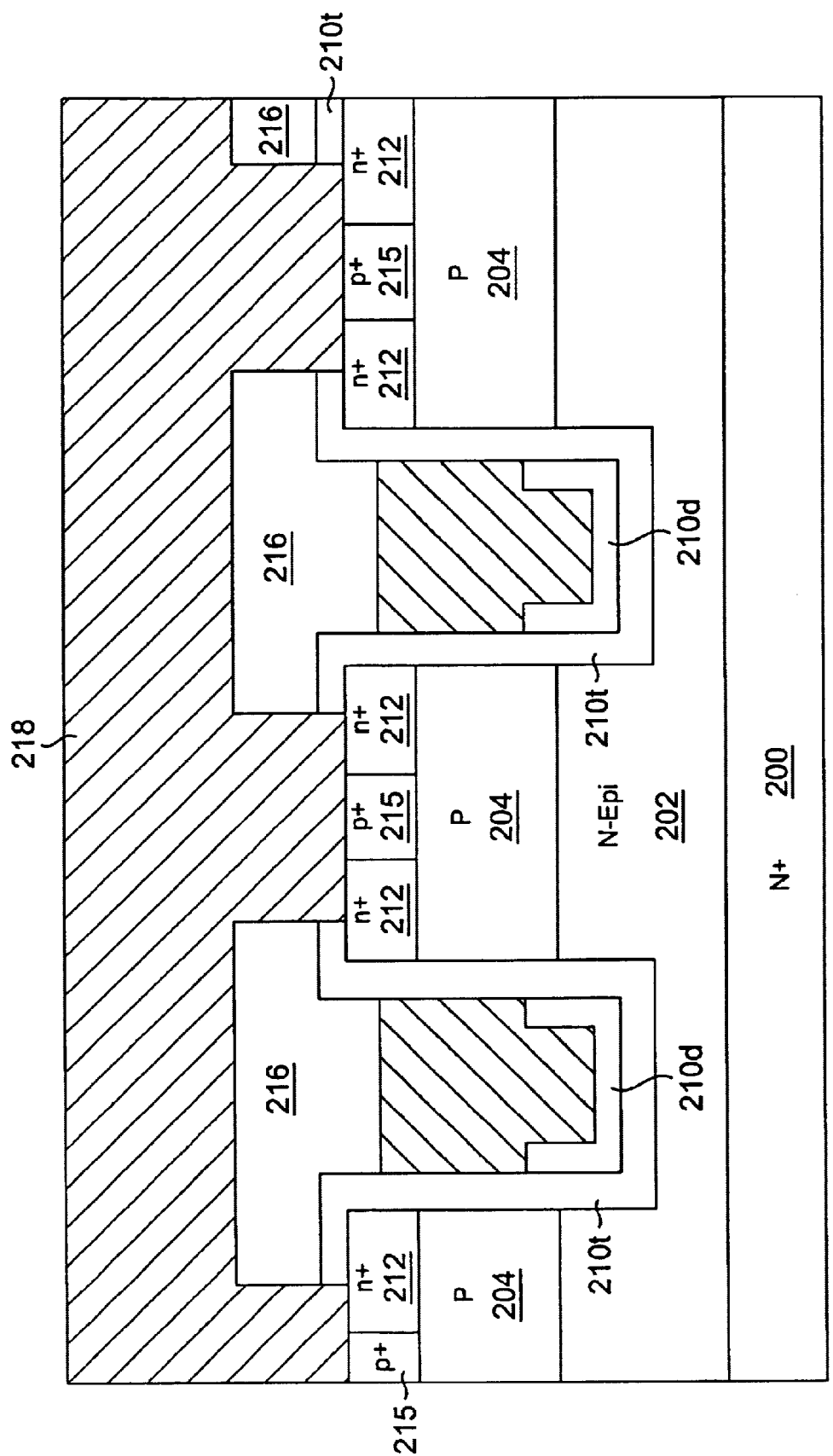

A BPSG (borophosphosilicate glass) layer is then formed over the entire structure, for example, by PECVD, and provided with a patterned photoresist layer (not shown). The structure is etched, typically by reactive ion etching, to remove the BPSG and oxide over at least a portion of each source region 212, leaving behind BPSG regions 216. After removing the photoresist layer, the structure is provided with a metal contact layer 218 (aluminum in this example), which acts as a source electrode. The resulting cross-sectional views of this structure are shown in FIG. 8G. In the same step, a separate metal contact is typically connected to the gate runner, which is located outside the cells. Another metal contact is typically provided in connection with the substrate 200, which acts as a drain electrode.

Figure 9A:
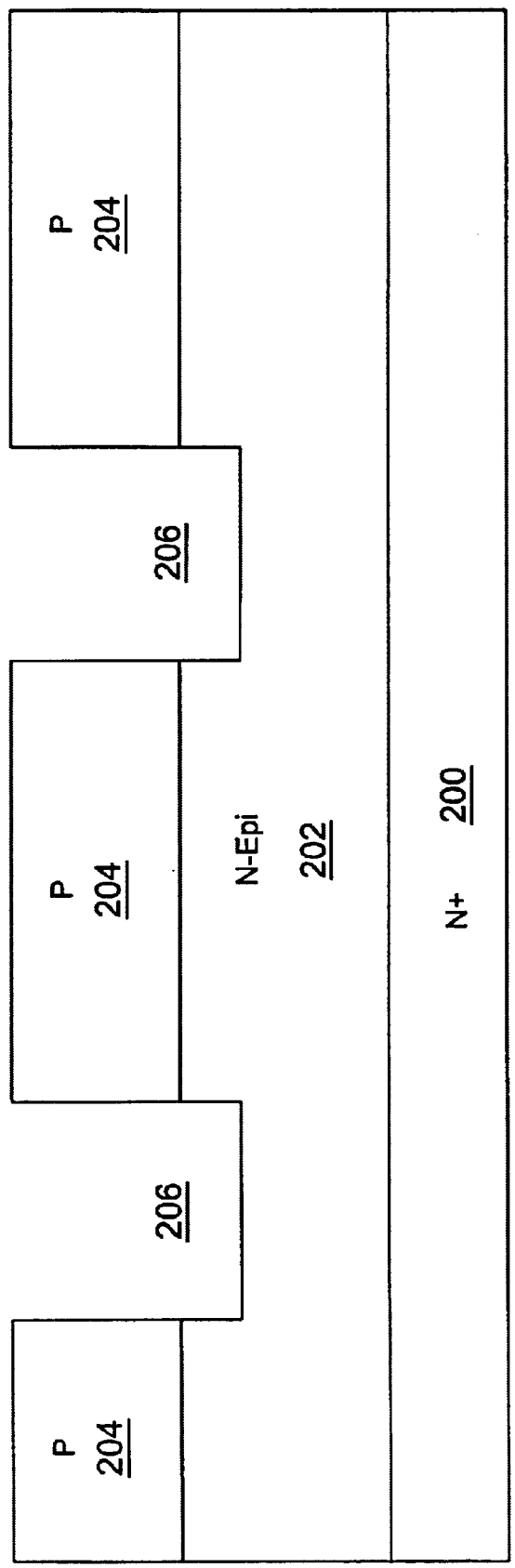
FIG. 9A through FIG. 9G are schematic partial cross-sectional views illustrating another process for manufacturing the trench MOSFET transistor device like that of FIG. 2.
Figure 9B:
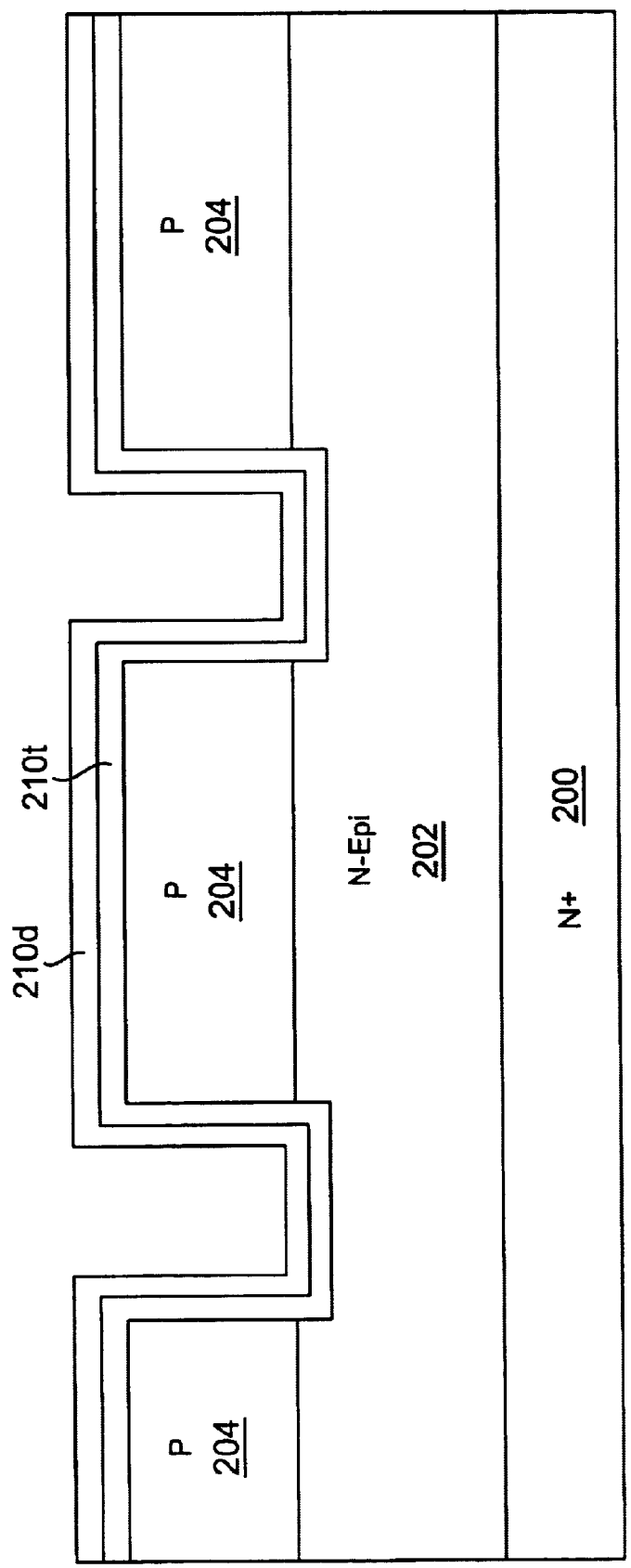

An alternate method for producing a trench MOSFET structure like that shown in FIG. 2 is illustrated in FIGS. 9A through 9G. The process for producing the structure of FIG. 9A is the same as that set forth above in connection with FIG. 8A. The process for producing FIG. 9B is the same as FIG. 8B, except that the TEOS layer 210 is densified in FIG. 9B following deposition to provide a high-density silicon dioxide layer 210d. As will become more apparent below, in contrast to the above procedure of FIGS. 8A through 8G, densification is performed at this earlier stage, because portions of the layer 210d are permanently covered by polysilicon in the following step.

Figure 9C:
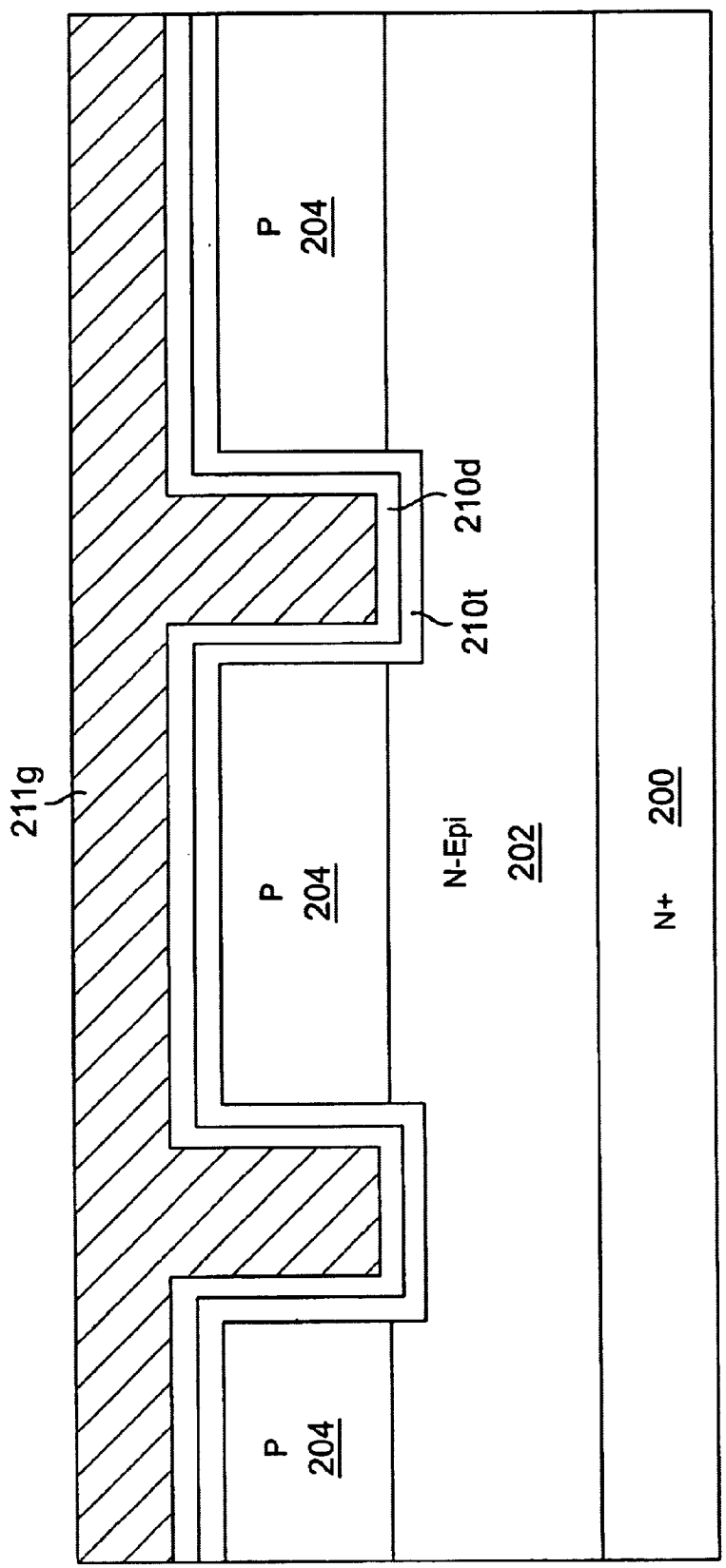
Figure 9D:
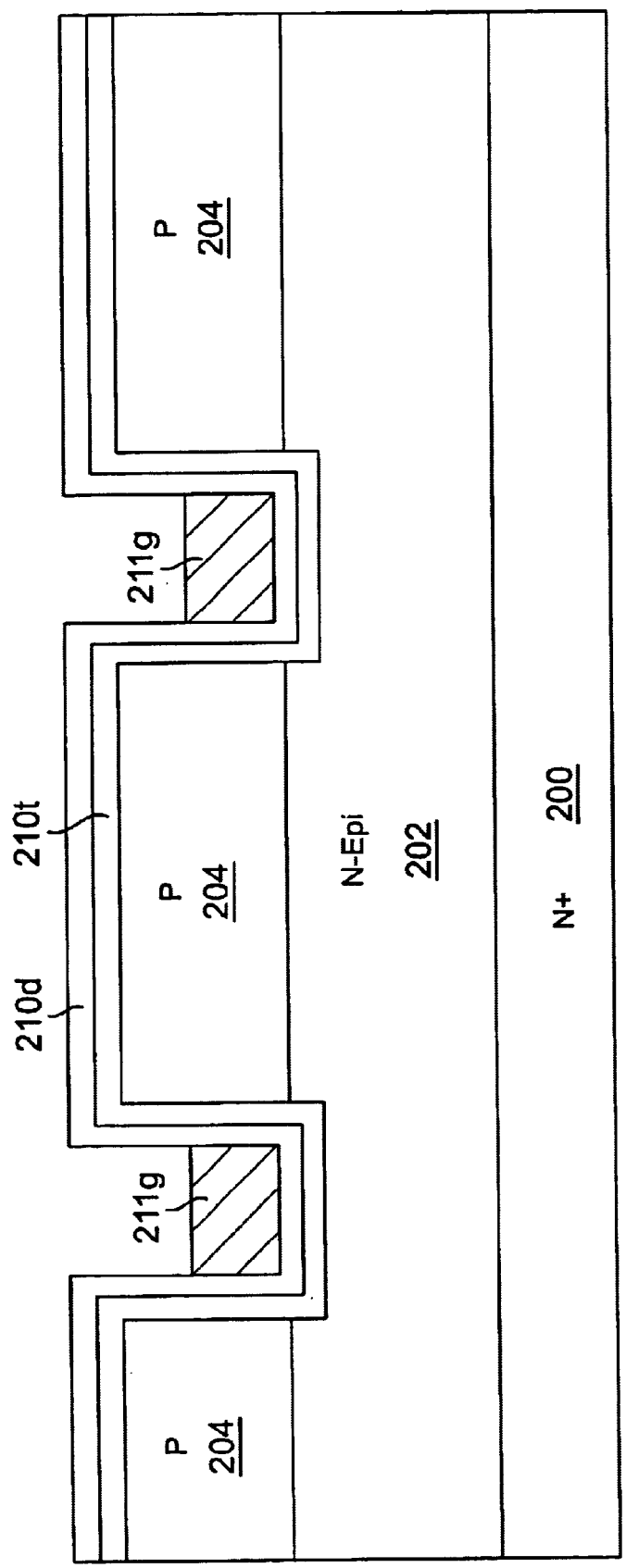

The surface of the structure is then covered, and the trenches are filled, with a doped polysilicon layer 211g in a manner like that described in FIG. 8F above, resulting in the structure of FIG. 9C. The polysilicon layer is then etched, for example, by reactive ion etching, until only the bottoms of the trenches are filled with the polysilicon 211g. The resulting structure is shown in FIG. 9D.

Figure 9E:
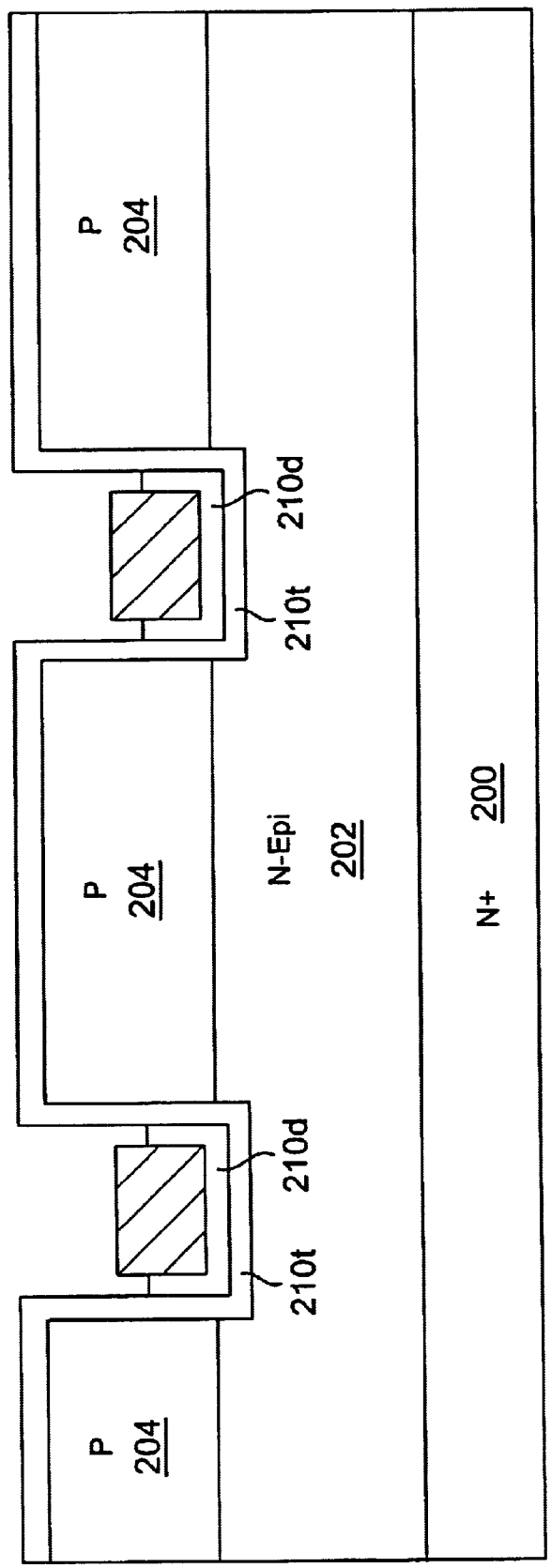
Figure 9F:
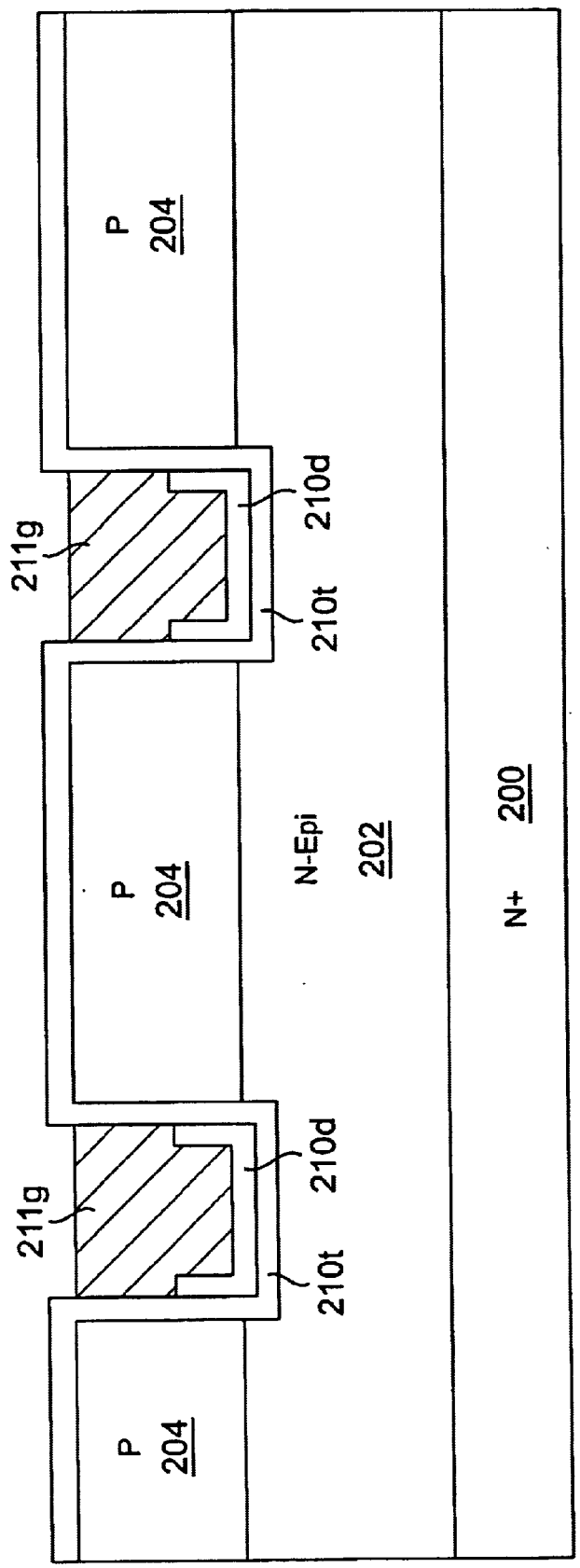
Figure 9G:
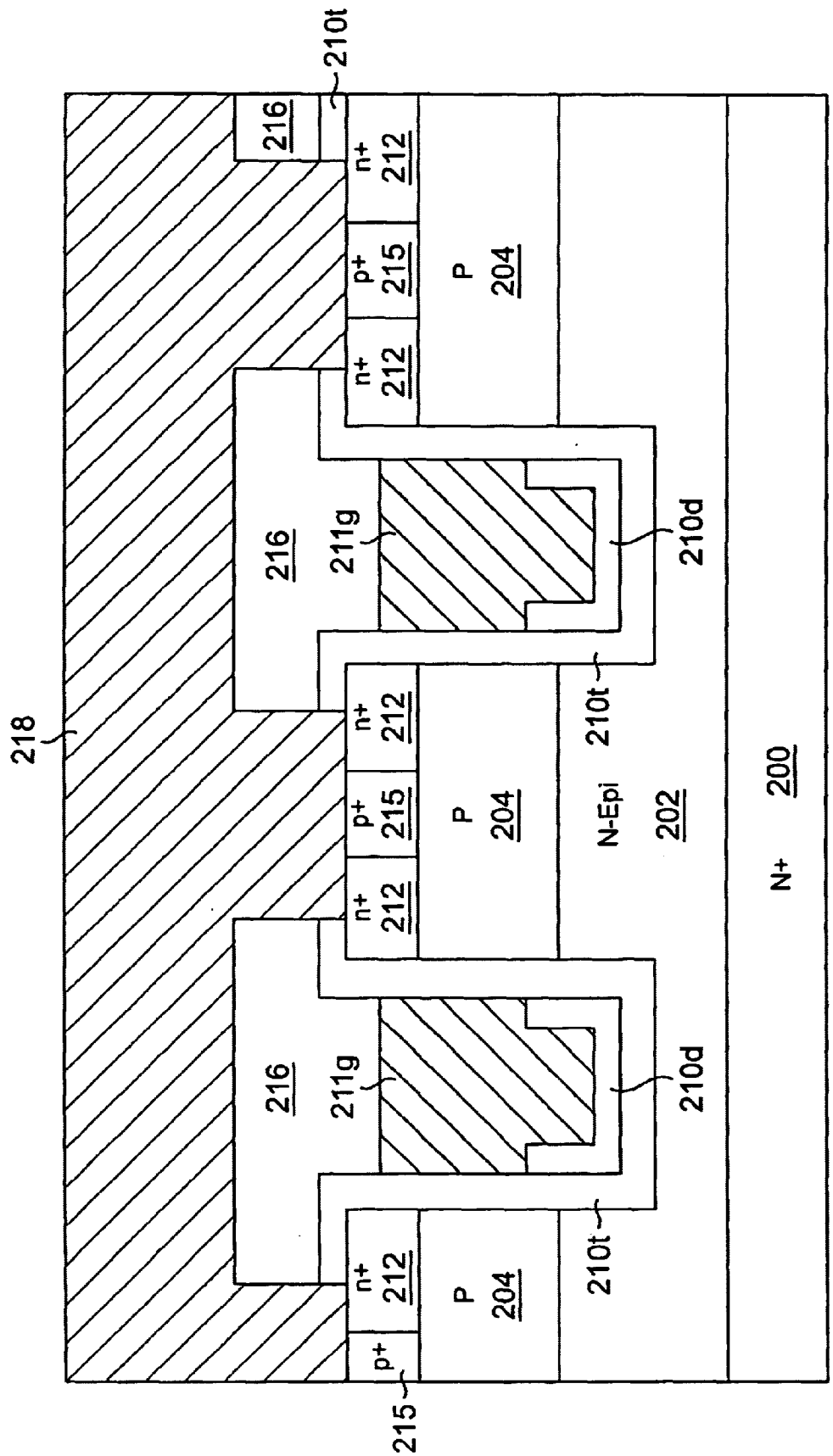

The densified silicon dioxide layer 210d is then etched, for example by reactive ion etching, removing all of silicon dioxide layer 210d, except where protected by the polysilicon 211g coving the trench bottoms. The resulting structure is shown in FIG. 9E. As in FIG. 8F above, the structure then undergoes an additional thermal oxidation step to ensure that those portions of the gate oxide layer 210t not covered by the deposited oxide 210d are of sufficient thickness. An additional layer of polysilicon is then provided, covering the surface and filling the trenches of the device. As previously discussed, also in connection with FIG. 8F, a patterned masking layer is provided to preserve polysilicon in the gate runner region, and the polysilicon layer is slightly over-etched, creating final polysilicon gate regions 211g within the trenches. The resulting structure is shown in FIG. 9F. Finally, the steps described above in connection with FIG. 8G are preformed, producing the device shown in FIG. 9G.

A method of producing a trench MOSFET structure like that shown in FIG. 3 will now be described in connection with FIGS. 10A through 10H.

Figure 10A:
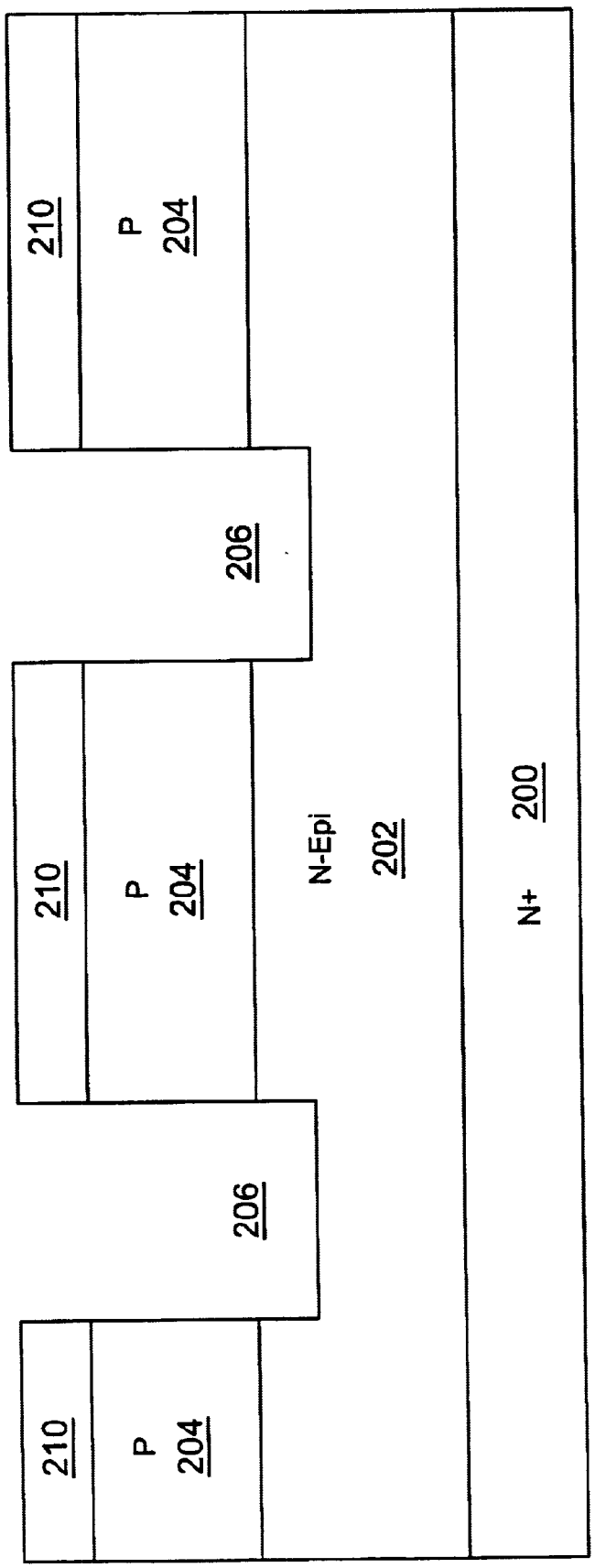
FIG. 10A through FIG. 10H are schematic partial cross-sectional views illustrating a process for manufacturing the trench MOSFET transistor device like that of FIG. 3.

As in the process of FIG. 8A, an N doped epitaxial layer 202 is initially grown on an N+ doped substrate 200. A P-type layer 204 is then formed in the epitaxial layer 202 by implantation and diffusion. A mask oxide layer is then deposited, and covered with a patterned trench mask (not shown). The mask oxide layer is then etched forming a patterned mask oxide layer 210. Trenches 206 are subsequently etched through apertures in the patterned mask oxide layer 210, establishing discrete P-body regions 204. The resulting structure is shown in FIG. 10A.

Figure 10B:
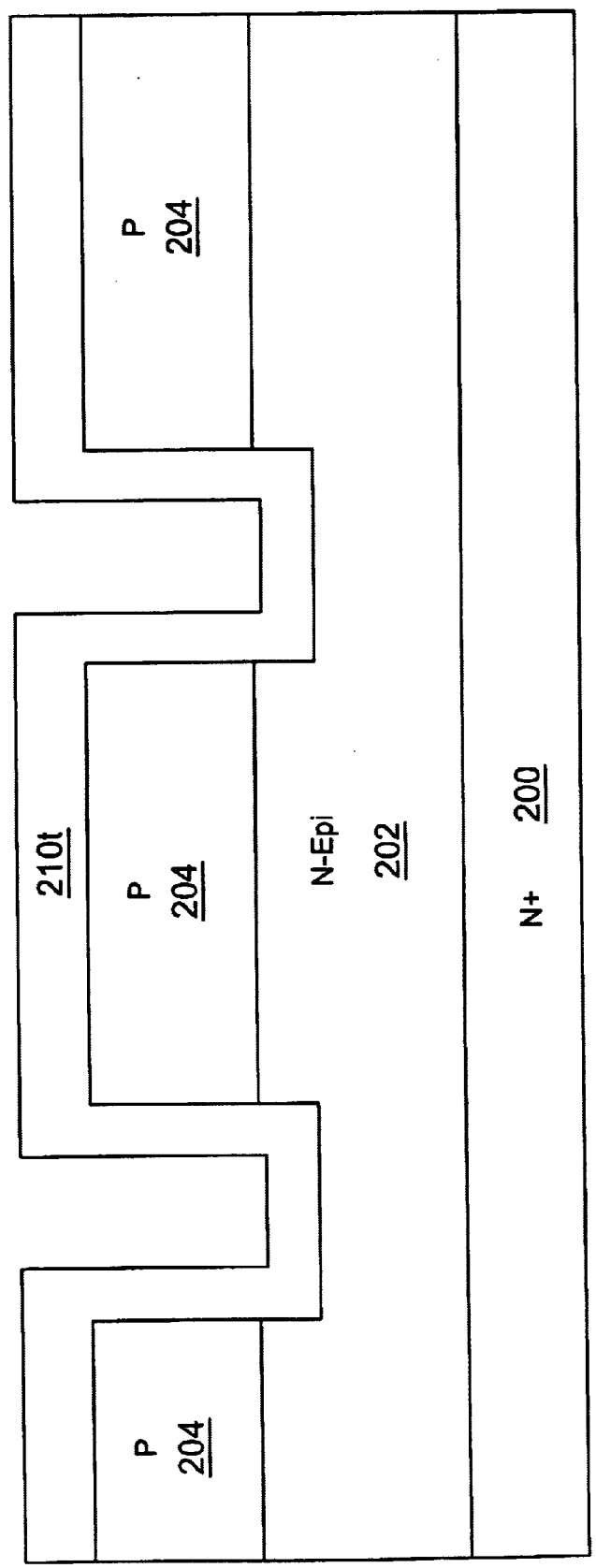

At this point, a thick oxide layer is grown over the entire structure, forming layer 210t (which also includes the patterned mask oxide layer 210 from the prior step). The resulting structure is shown in FIG. 10B. The thick oxide layer is grown by thermal oxidation, for example, by either wet or dry oxidation at 950 to 1150° C. for a period of 10 to 120 minutes. After oxidation, the thick oxide layer is preferably 500 to 2000 microns in thickness.

Figure 10C:
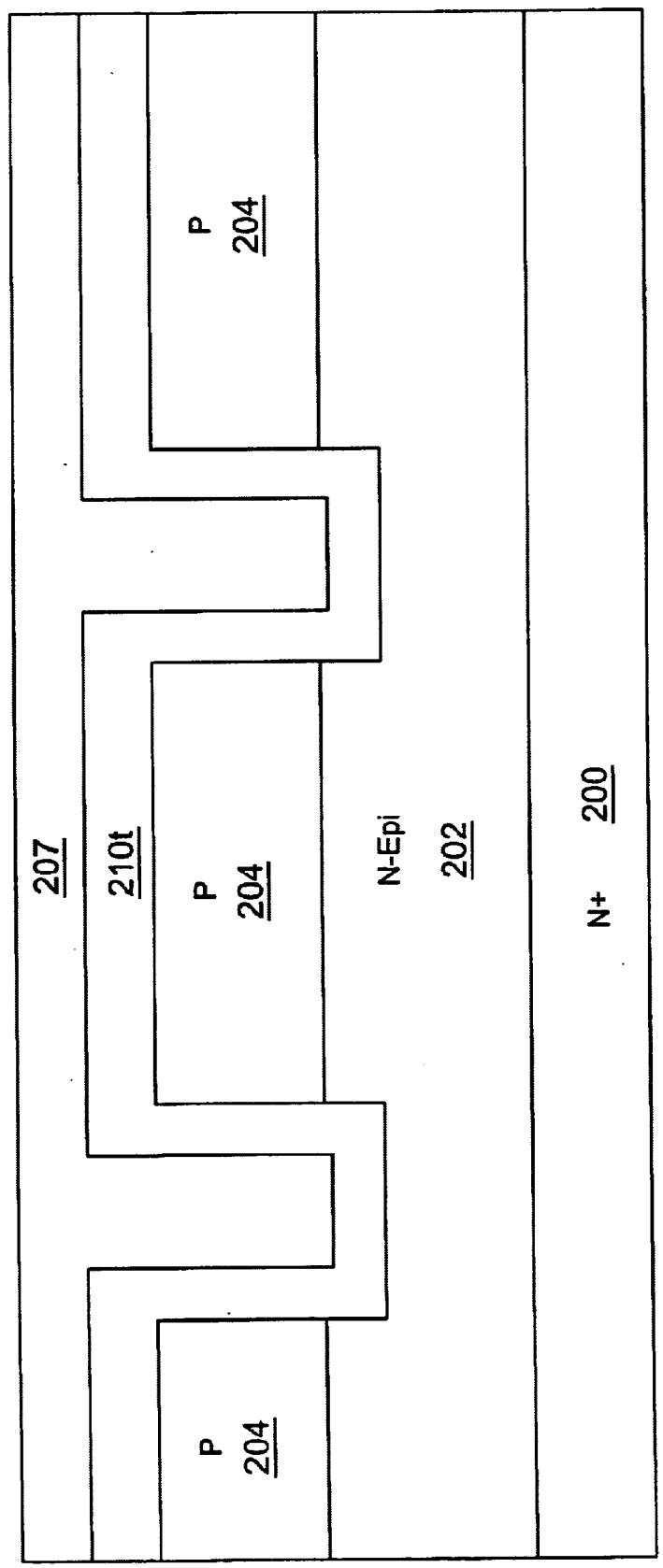
Figure 10D:
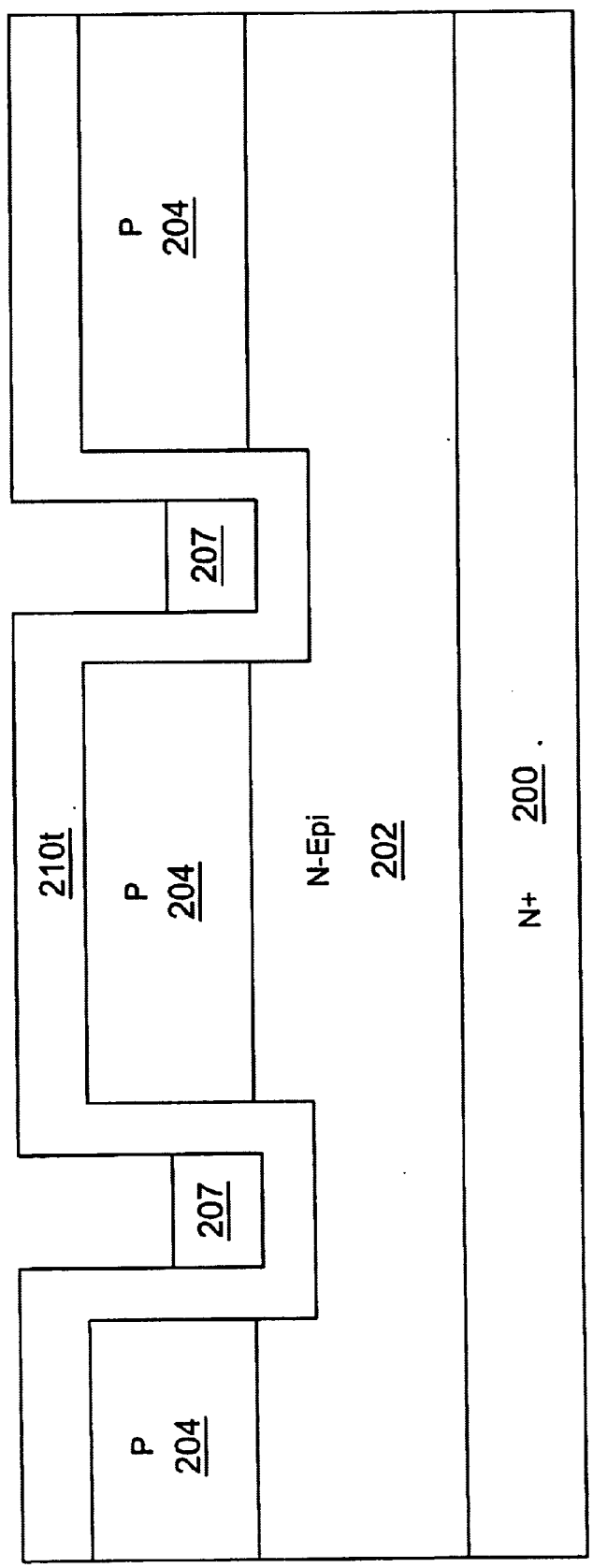

The surface of the structure is then covered, and the trenches are filled, with a photoresist layer 207 to provide the structure of FIG. 10C. The resist layer is then etched, for example, by reactive ion etching, until all of the photoresist is removed except photoresist portions 207 at the bottom of the trenches, providing the structure of FIG. 10D.

Figure 10E:
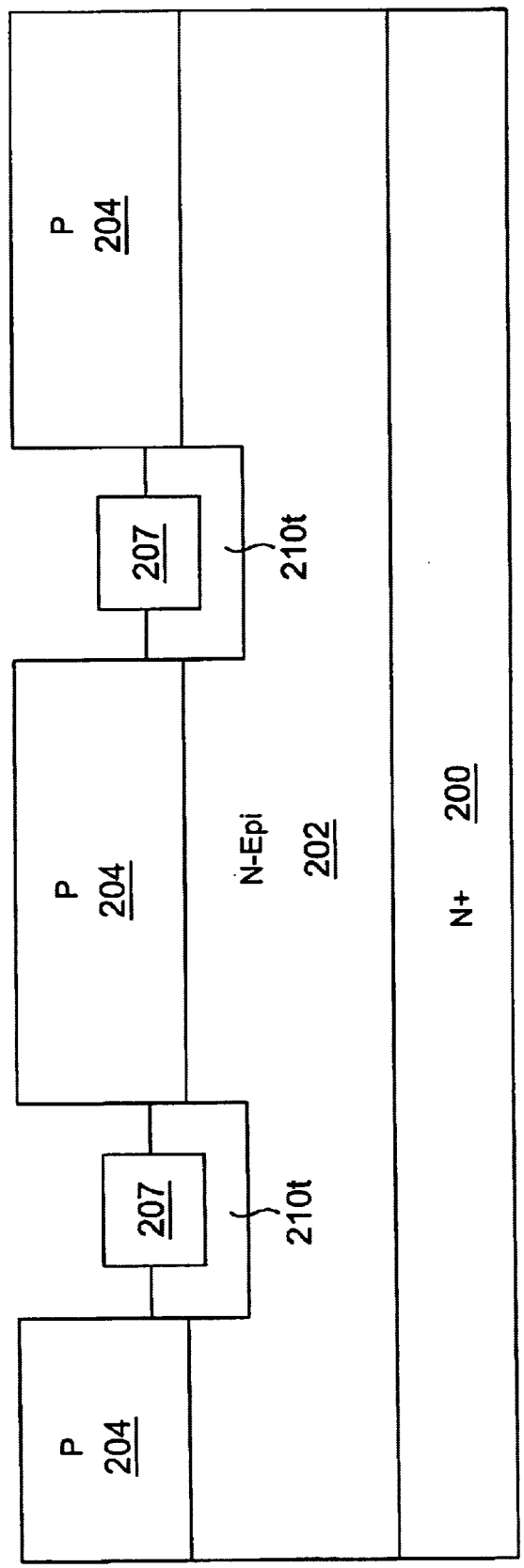

The oxide layer 210t is then etched, for example by reactive ion etching, removing all of thick oxide layer, except where it is protected by the photoresist covering the trench bottoms, resulting in distinct, thick thermally grown oxide regions 210t as shown in FIG. 10E.

Figure 10F:
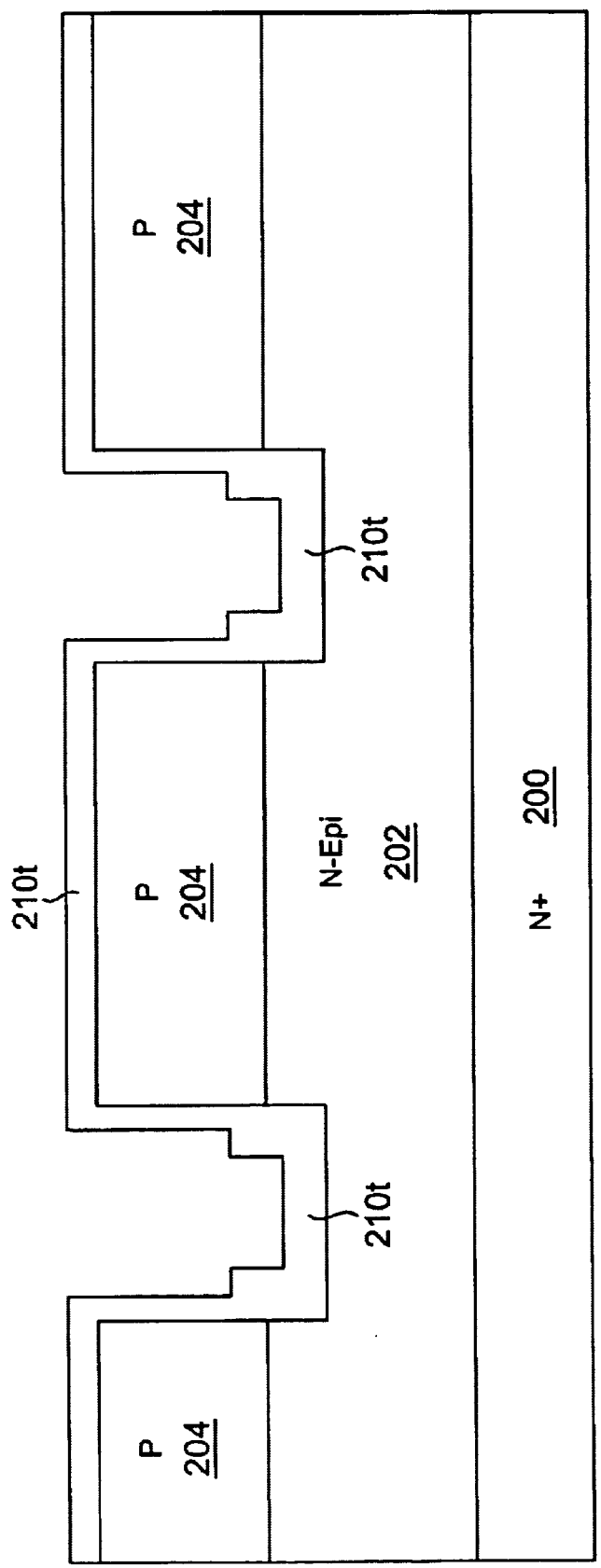

The remaining photoresist 207 is then removed, for example, by sulfuric acid. Subsequently, a thin gate oxide layer is formed on the exposed silicon surfaces of the structure, for example, by dry oxidation at 950 to 1150° C. This thin gate oxide layer is typically 100 to 1000 Angstroms in thickness. As shown in FIG. 10F, this oxidation step results in a thermally grown oxide layer 210t having thick regions at the trench bottoms and thin regions on upper portions of the trench sidewalls (as well as on top of the structure).

Figure 10G:
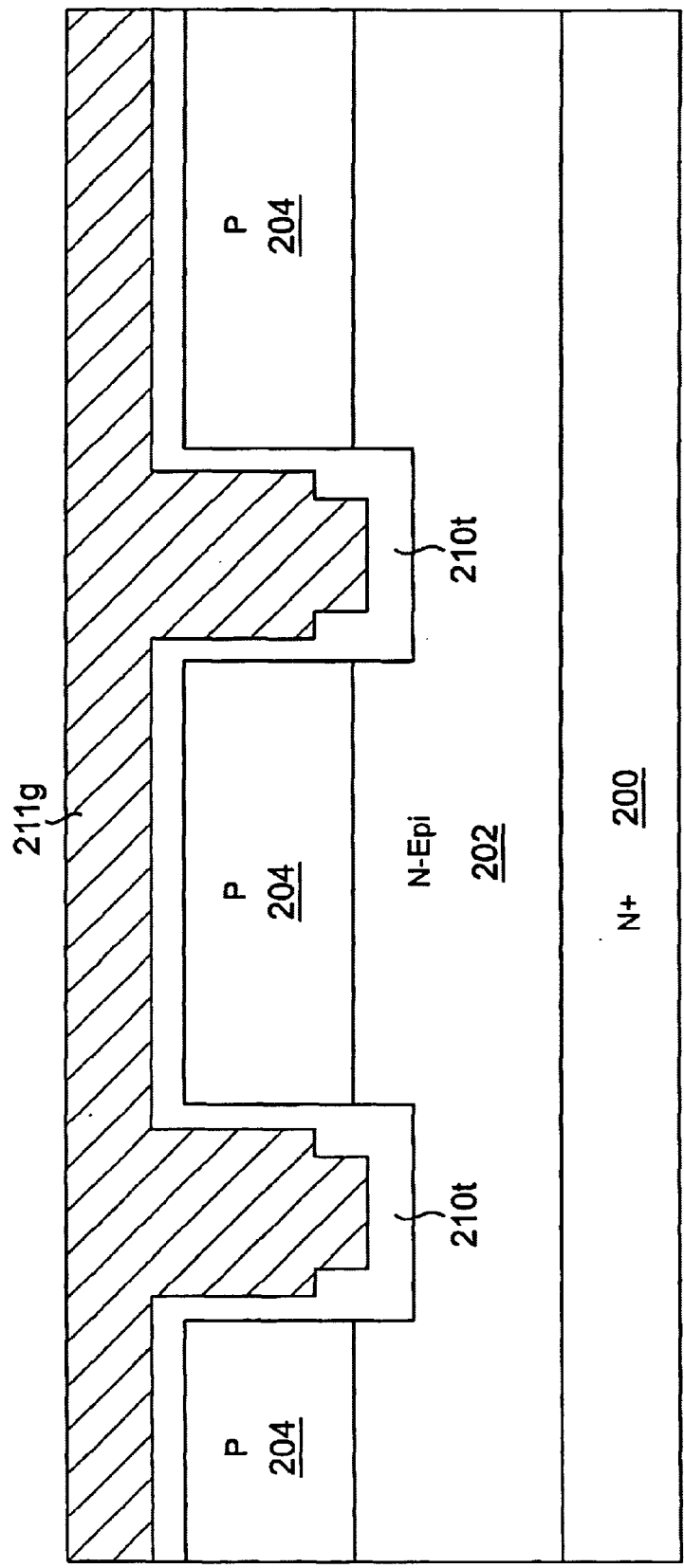
Figure 10H:
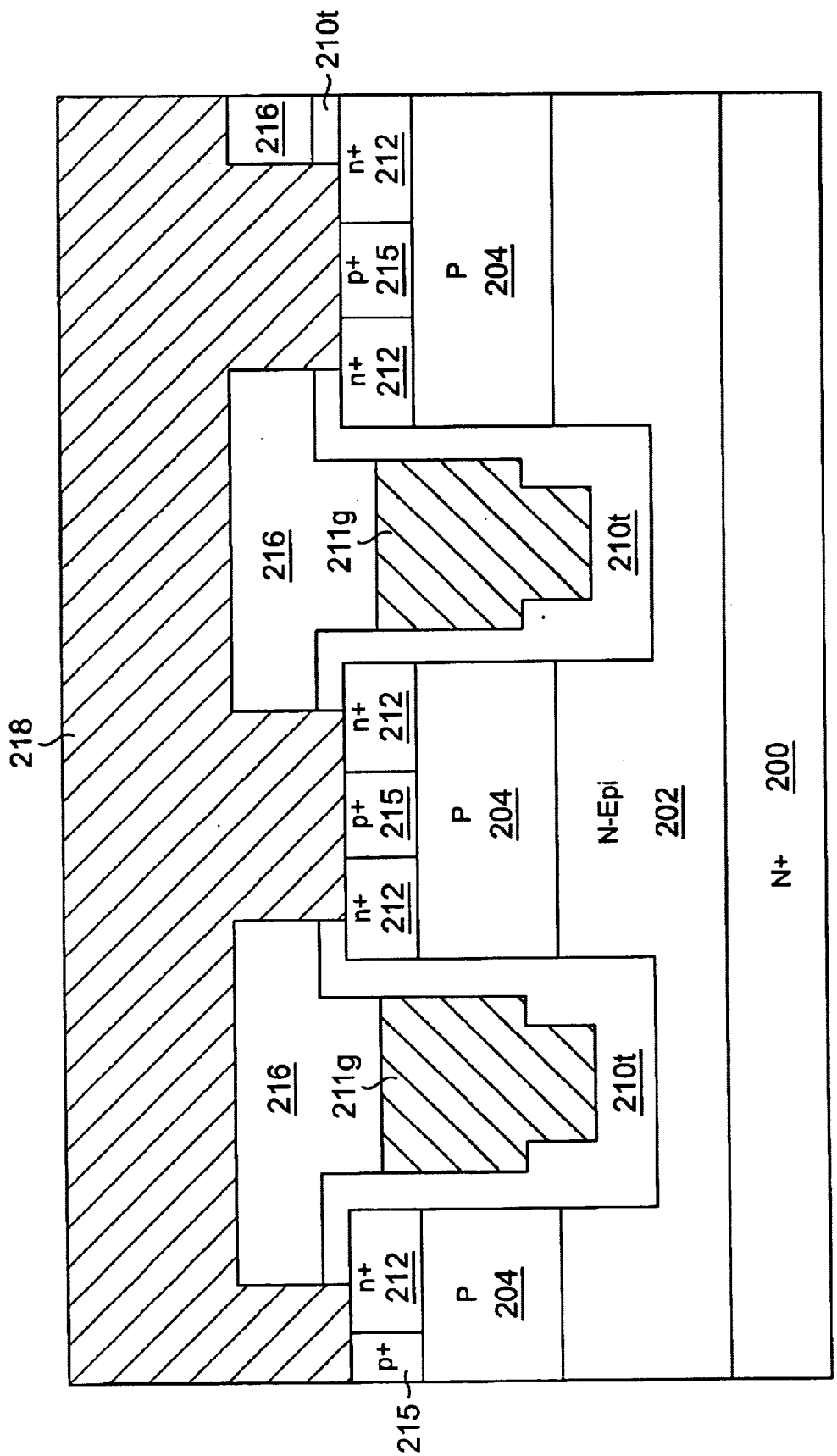

A layer of polysilicon 211g for the gate region is provided over the entire structure, covering the surface and filling the trenches of the device as shown in FIG. 10G. The device is completed from this point as discussed above in connection with FIGS. 8F and 8G, producing the structure of FIG. 10H.

Figure 11A:
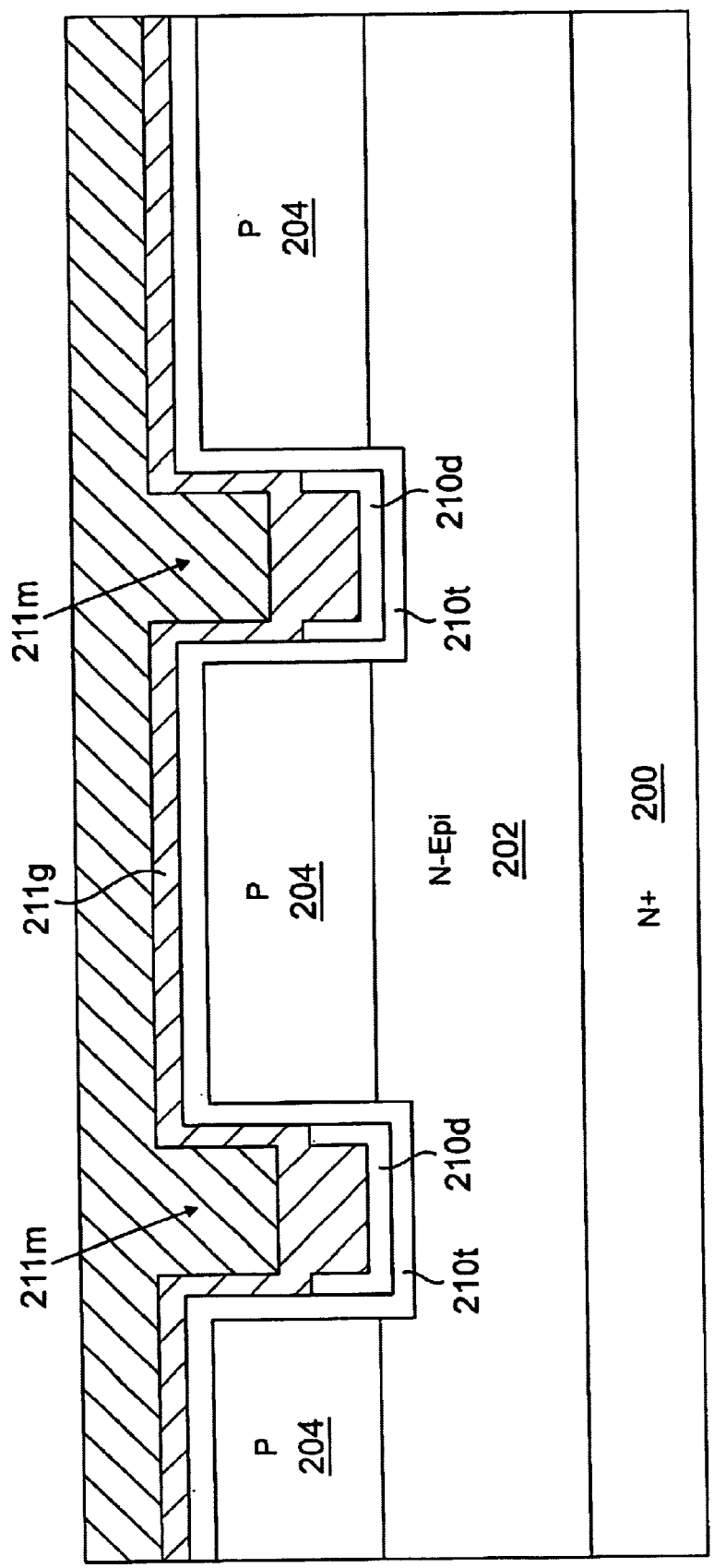
FIG. 11A through FIG. 11C are schematic partial cross-sectional views illustrating a process for manufacturing the trench MOSFET transistor devices like those of FIG. 4 and FIG. 5.
Figure 11B:
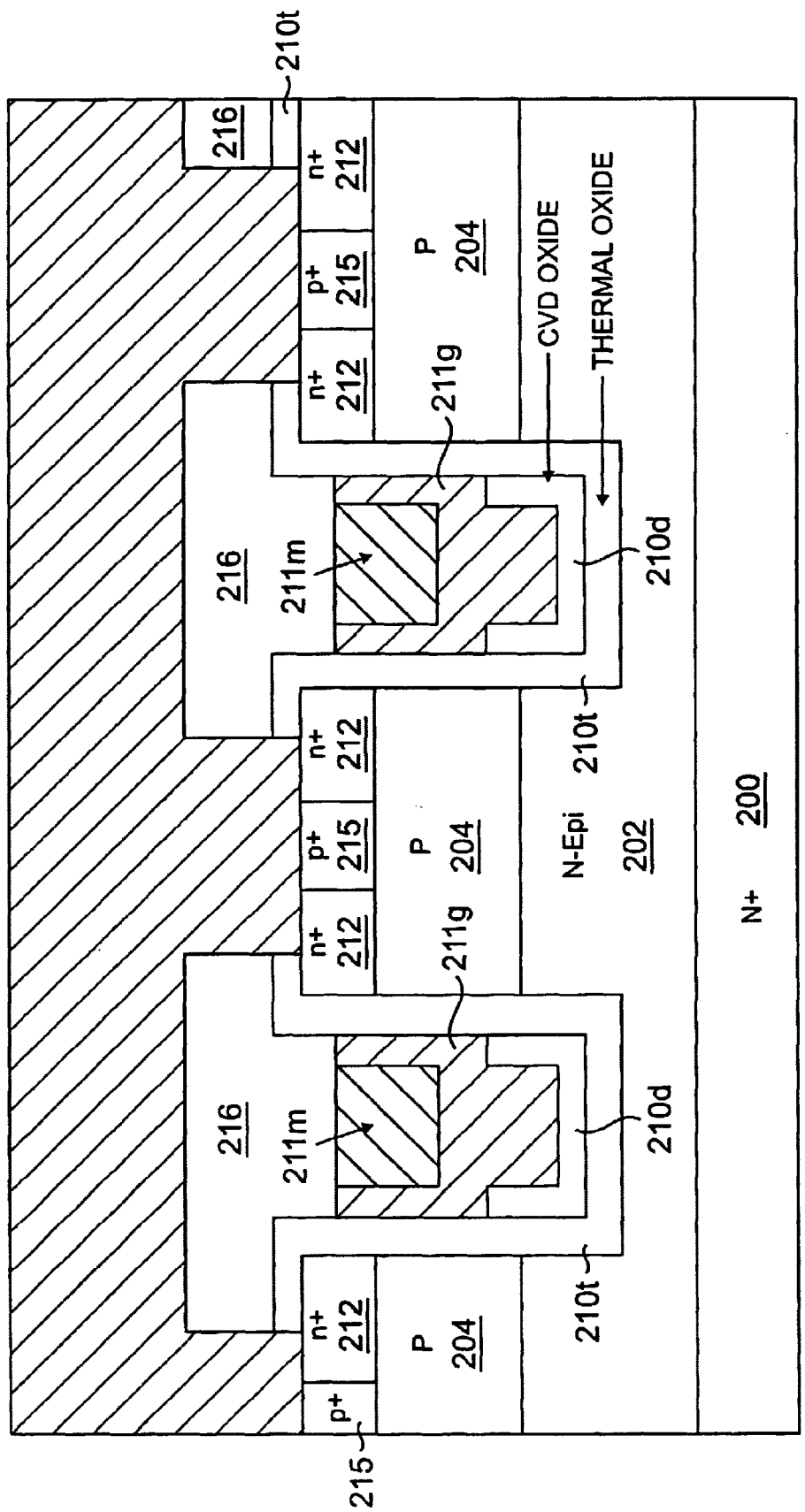

A method of producing a trench MOSFET structure like that shown in FIG. 4 will now be described in connection with FIG. 11A and FIG. 11B.

This process is the same as that discussed above in connection with FIGS. 8A through FIG. 8E. At this point, the remaining resist is removed, the TEOS layer is densified to provide a high-density silicon dioxide layer 210d, and the gate oxide layer 211t is thickened as in FIG. 8F above. However, a substantially thinner polysilicon layer 211g is provided over the surface of the device and in the trenches, such that the trenches are not filled by the polysilicon 211g. Instead, trench filling is completed by depositing a metal layer 211m of either tungsten (W) or a titanium-tungsten alloy (TiW) (or Tungsten Silicide (WSi), if desired) using techniques known in the art such as CVD. The resulting structure is shown in FIG. 11A.

As above, a patterned masking layer is provided to preserve the polysilicon, as well as the W/TiW, in the gate runner region, and the layers of polysilicon 211g and W/TiW 211m are slightly over-etched, producing composite gate regions consisting of polysilicon 211g and W/TiW 211m. Finally, the steps described above in connection with FIG. 8G are preformed, producing the device of FIG. 11B.

Figure 11C:
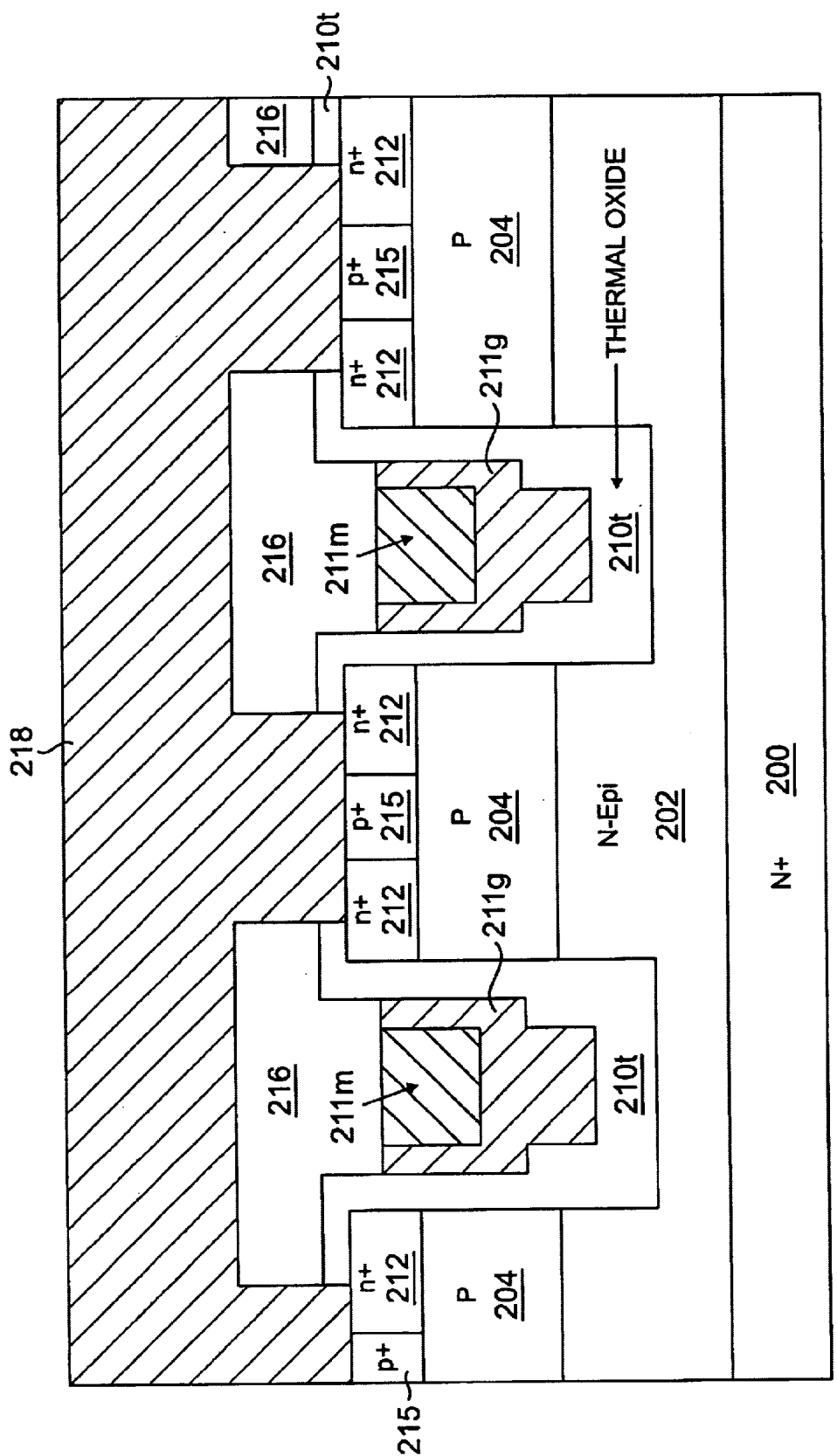

A method of producing a trench MOSFET structure like that shown in FIG. 5 is now described in connection with FIG. 11C. This process is the same as that of FIGS. 10A through 10F. At this point, however, the trenches are not filled with polysilicon. Instead, a relatively thin polysilicon layer 211g is provided over the surface of the device and in the trenches. The trenches are then filled by depositing a metal layer 211m of either tungsten (W) or a titanium-tungsten alloy (TiW) (or Tungsten Silicide (WSi), if desired) and the structure is completed as discussed in connection with FIG. 11B. The completed structure is shown in FIG. 11C.

Figure 12A:
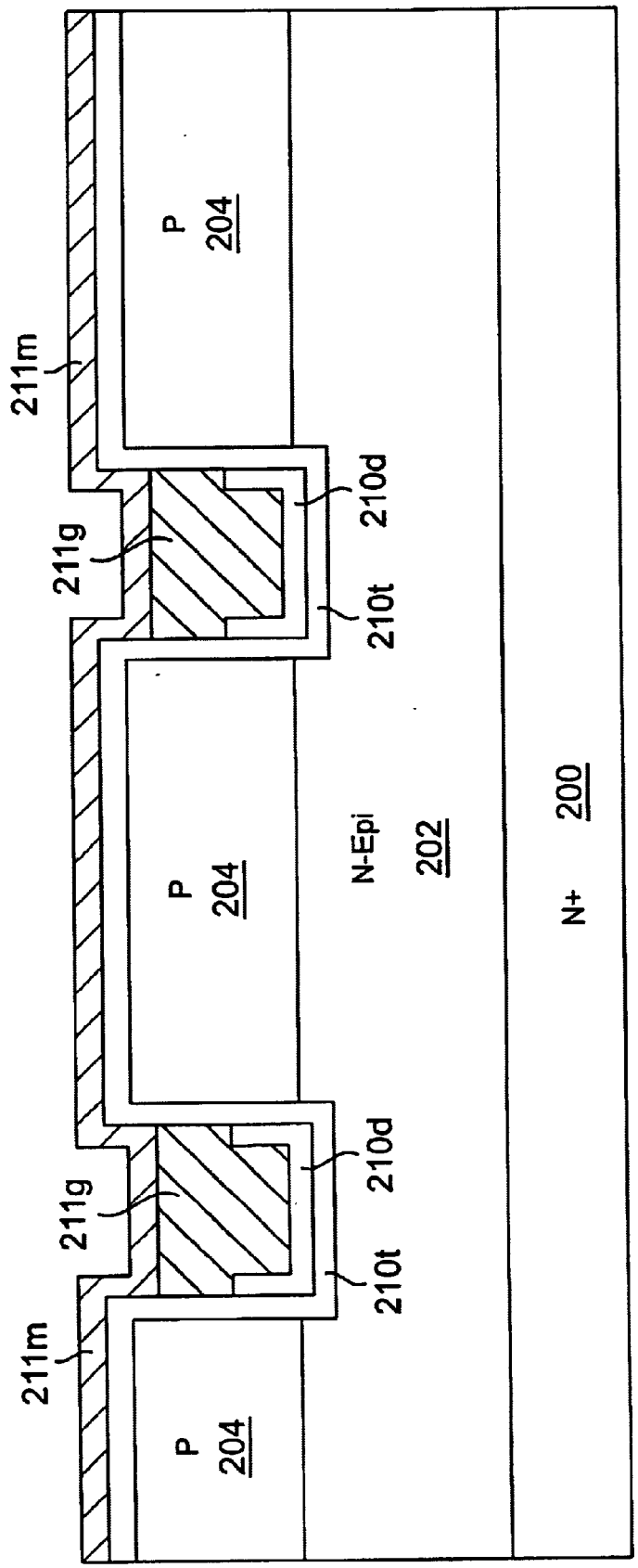
FIG. 12A through FIG. 12C are schematic partial cross-sectional views illustrating a process for manufacturing the trench MOSFET transistor devices like those of FIG. 6 and FIG. 7.
Figure 12B:
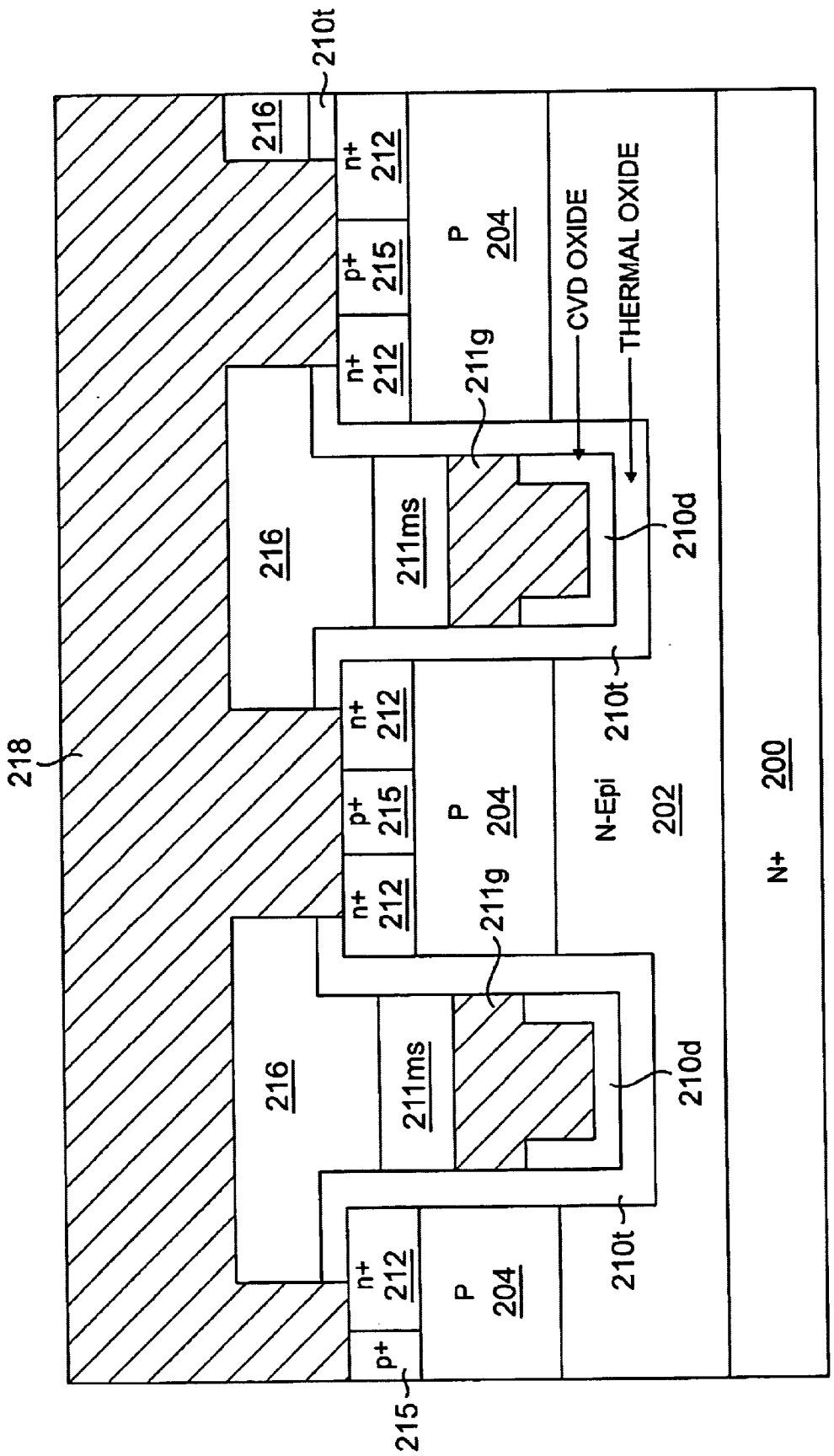

A method of producing a trench MOSFET structure like that shown in FIG. 6 is described in connection with FIG. 12A and FIG. 12B. The method is essentially the same as that discussed above in connection with FIGS. 8A through 8F, except that the polysilicon layer within the trench segment is more heavily over-etched, such that the polysilicon gate regions 211g within the trenches typically have top surfaces that are 0.1 to 0.5 microns below the adjacent surface of the epitaxial layer 204. The patterned masking layer, which served to preserve polysilicon in the gate runner region, is removed and a refractory metal layer 211m such as a titanium layer is deposited, for example, by sputtering, to produce the structure of FIG. 12A. The refractory metal is then alloyed with polysilicon in the trench by rapid thermal anneal, forming refractory metal silicide regions 211ms (in this case titanium silicide (TiSi$_2$)). The non reacted Ti portion on the oxide layer is removed after TiSi$_2$ is formed in trench region. The steps described above in connection with FIG. 8G are then preformed, producing the device of FIG. 12B.

Figure 12C:
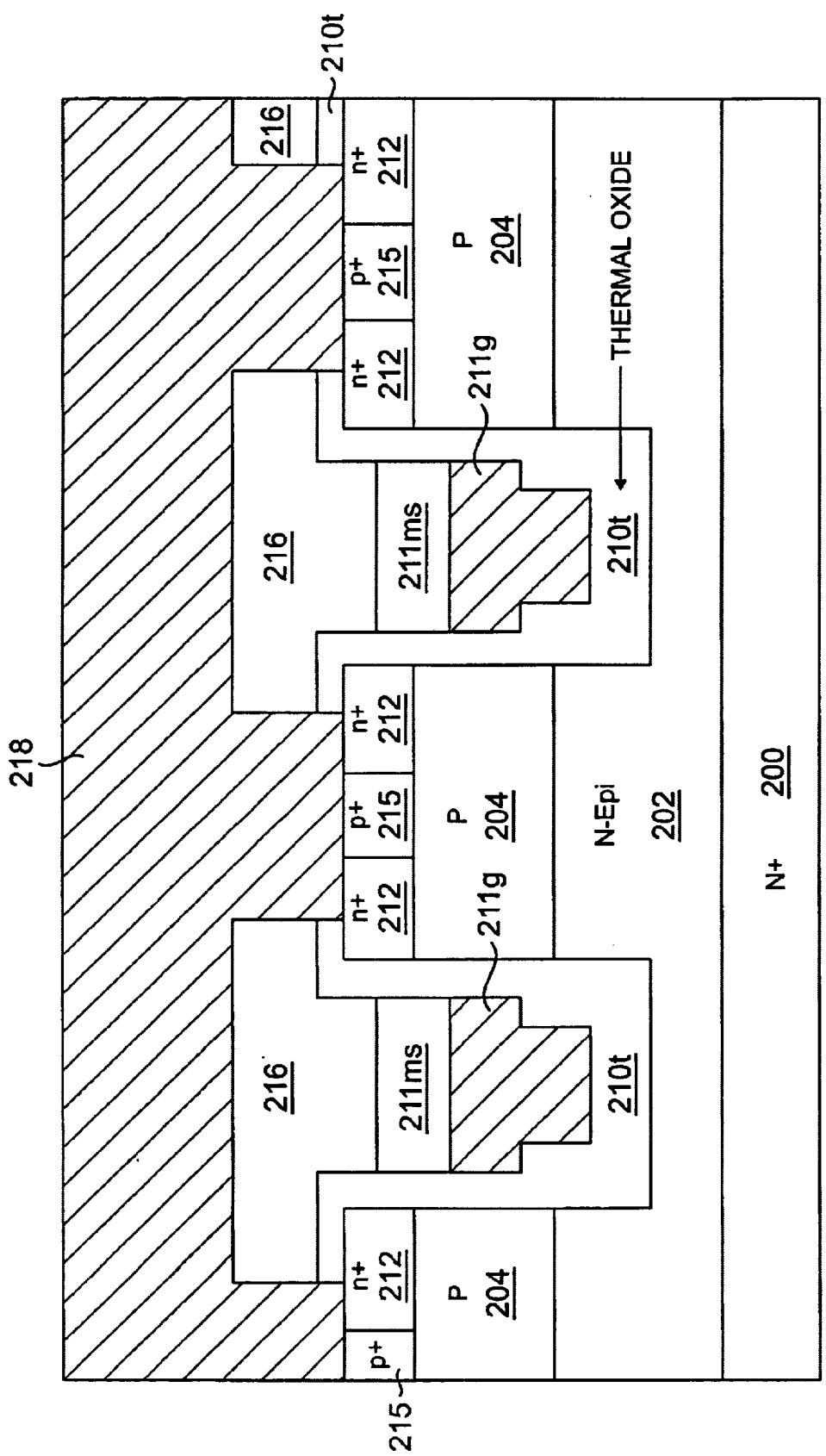

A method of producing a trench MOSFET structure like that shown in FIG. 7 is described in connection with FIG. 12C. The method is essentially the same as that discussed above in connection with FIG. 10A through FIG. 10G. After applying the patterned masking layer to preserve polysilicon in the gate runner region, the procedures discussed in connection with FIG. 12A and FIG. 12B above are followed, producing the structure of FIG. 12C.

Although various embodiments are specifically illustrated and described herein, it will be appreciated that modifications and variations of the present invention are covered by the above teachings and are within the purview of the appended claims without departing from the spirit and intended scope of the invention. As one example, the method of the present invention may be used to form a structure in which the conductivities of the various semiconductor regions are reversed from those described herein.

What is claimed is:

1. A trench MOSFET device comprising:
   a silicon substrate of a first conductivity type;
   a silicon epitaxial layer of said first conductivity type over said substrate, said epitaxial layer having a lower majority carrier concentration than said substrate;
   a body region of a second conductivity type within an upper portion of said epitaxial layer;
   a trench extending into said epitaxial layer from an upper surface of said epitaxial layer, said trench extending through said body region, and said trench having trench sidewalls and a trench bottom;
   an oxide region lining said trench, said oxide region comprising a lower segment covering at least the trench bottom and upper segments covering at least upper regions of said trench sidewalls;
   a conductive region within said trench adjacent said oxide region; and
   a source region of said first conductivity type within an upper portion of said body region and adjacent said trench,
   wherein said lower segment of said oxide region is thicker than said upper segments of said oxide region such that shoulders are established in said oxide region adjacent said conductive region along said trench sidewalls, and
   wherein said lower segment of said oxide region consists of two structurally distinct portions, a thermally grown portion adjacent said trench and a deposited oxide portion adjacent said conductive region and in contact with said thermally grown portion having different operational characteristics than said deposited oxide portion, and wherein said upper segments of said oxide region consists of thermally grown oxide.

2. The trench MOSFET device of claim 1, wherein said deposited oxide portion is densified TEOS.

3. The trench MOSFET device of claim 1, wherein said thermally grown portion ranges from 500 to 2000 Angstroms in thickness.

4. The trench MOSFET device of claim 1, wherein said deposited oxide portion ranges from 500 to 2000 Angstroms in thickness.

5. The trench MOSFET device of claim 1, wherein said upper segment of said oxide region ranges from 100 to 1000 Angstroms in thickness.

6. The trench MOSFET device of claim 1, wherein said lower segment of said oxide region is a thick thermally grown oxide region, and wherein said upper segments of said oxide region are thin thermally grown oxide regions.

7. The trench MOSFET device of claim 6, wherein said thick thermally grown oxide region ranges from 500 to 2000 Angstroms in thickness.

8. The trench MOSFET device of claim 6, wherein said thin thermally grown oxide region ranges from 100 to 1000 Angstroms in thickness.

9. The trench MOSFET device of claim 1, wherein the conductive region comprises polycrystalline silicon.

10. The trench MOSFET device of claim 1, wherein the conductive region comprises a polycrystalline silicon portion and a portion selected from a refractory metal and a refractory metal alloy.

11. The trench MOSFET device of claim 10, wherein the conductive region comprises a polycrystalline silicon portion and a tungsten portion.

12. The trench MOSFET device of claim 10, wherein the conductive region comprises a polycrystalline silicon portion and a titanium-tungsten alloy portion.

13. The trench MOSFET device of claim 1, wherein the conductive region comprises a polycrystalline silicon portion and a refractory metal silicide portion.

14. The trench MOSFET device of claim 13, wherein the conductive region comprises a polycrystalline silicon portion and a titanium silicide portion.

15. The trench MOSFET device of claim 1, wherein said first conductivity type is N-type conductivity and said second conductivity type is P-type conductivity.

16. A trench MOSFET device comprising:
   a silicon substrate of a first conductivity type;
   a silicon epitaxial layer of said first conductivity type over said substrate, said epitaxial layer having a lower majority carrier concentration than said substrate;
   a body region of a second conductivity type within an upper portion of said epitaxial layer;
   a trench extending into said epitaxial layer from an upper surface of said epitaxial layer, said trench extending through said body region, and said trench having trench sidewalls and a trench bottom;
   an oxide region lining said trench, said oxide region comprising a u-shaped lower segment covering the trench bottom and lower regions of said trench sidewalls and upper segments covering upper regions of said trench sidewalls, wherein said lower segment of said oxide region is thicker than said upper segments;
   a conductive region within said trench adjacent said oxide region; and
   a source region of said first conductivity type within an upper portion of said body region and adjacent said trench, and
   wherein said lower segment of said oxide region consists of two structurally distinct portions, a thermally grown portion adjacent said trench and a deposited oxide portion adjacent said conductive region and in contact with, said thermally grown portion having different operational characteristics than said deposited oxide portion, and wherein said upper segments of said oxide region consists of thermally grown oxide.

* * * * *

UNITED STATES PATENT AND TRADEMARK OFFICE
CERTIFICATE OF CORRECTION

PATENT NO. : 6,674,124 B2
APPLICATION NO. : 10/002529
DATED : January 6, 2004
INVENTOR(S) : Fwu-Iuan Hshieh et al.

It is certified that error appears in the above-identified patent and that said Letters Patent is hereby corrected as shown below:

Col. 1, line 43, first word, change "1,2" to --1, 2--.

Col. 1, line 43, after "drain", change "1,2" to --1, 2--.

Col. 2, line 60, after "According", add --to--.

Col. 3, line 40, after "According", add --to--.

Col. 3, line 52, after "(i) a", change "unshaped" to --u-shaped--.

Col. 3, line 58, after "the", second occurrence, change "unshaped" to --u-shaped--.

Col. 5, line 52, after "from", add --,--.

Col. 7, line 2, after "rather", add --than--.

Col. 7, line 31, first word, change "bout" to --about--.

Col. 9, line 13, after "211*g*", change "coving" to --covering--.

Col. 9, line 25, after "are", change "preformed" to --performed--.

Col. 10, line 19, after "(or", change "Tungsten Silicide" to --tungsten silicide--.

Col. 10, line 28, after "are", change "preformed" to --performed--.

Col. 10, line 37, after "(or", change "Tungsten Silicide" to --tungsten silicide--.

Col. 10, line 60, after "are then", change "preformed" to --performed--.

Col. 11, line 43, Claim 1, after "portion", add --, said thermally grown portion--.

Col. 11, line 50, Claim 3, after "from", change "500to" to --500 to--.

UNITED STATES PATENT AND TRADEMARK OFFICE
CERTIFICATE OF CORRECTION

PATENT NO. : 6,674,124 B2
APPLICATION NO. : 10/002529
DATED : January 6, 2004
INVENTOR(S) : Fwu-Iuan Hshieh et al.

It is certified that error appears in the above-identified patent and that said Letters Patent is hereby corrected as shown below:

Col. 12, line 56, Claim 16, after "with", add --said thermally grown portion--.

Signed and Sealed this

First Day of April, 2008

JON W. DUDAS
*Director of the United States Patent and Trademark Office*